(12) United States Patent
Furuse

(10) Patent No.: US 9,529,026 B2
(45) Date of Patent: Dec. 27, 2016

(54) ANGLE DETECTOR, MOTOR DRIVE CONTROLLER, AND MOTOR DEVICE

(71) Applicant: Katsuhisa Furuse, Hyogo (JP)

(72) Inventor: Katsuhisa Furuse, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 38 days.

(21) Appl. No.: 14/693,025

(22) Filed: Apr. 22, 2015

(65) Prior Publication Data

US 2015/0308858 A1 Oct. 29, 2015

(30) Foreign Application Priority Data

Apr. 25, 2014 (JP) ................... 2014-091823

(51) Int. Cl.

| G01R 33/06 | (2006.01) |
|---|---|
| G01R 25/00 | (2006.01) |
| G01D 5/14 | (2006.01) |
| H02P 6/16 | (2016.01) |
| H02K 29/08 | (2006.01) |

(52) U.S. Cl.
CPC .............. G01R 25/00 (2013.01); G01D 5/145 (2013.01); H02K 11/225 (2016.01); H02P 6/16 (2013.01); *H02K 29/08* (2013.01)

(58) Field of Classification Search
CPC ............ H02P 6/16; G01D 5/145; H02K 29/08
USPC .......................................... 324/207.12, 207.2
See application file for complete search history.

(56) References Cited

U.S. PATENT DOCUMENTS

| 5,493,187 A * | 2/1996 | Iijima ....................... H02P 6/20 318/400.14 |
|---|---|---|
| 2013/0099708 A1 | 4/2013 | Shimizu et al. |
| 2013/0106326 A1 | 5/2013 | Kamatani et al. |
| 2013/0106327 A1 | 5/2013 | Kamatani et al. |
| 2014/0347040 A1 | 11/2014 | Kawase |
| 2014/0354271 A1 | 12/2014 | Kawase |
| 2014/0361715 A1 | 12/2014 | Murata |
| 2014/0365167 A1 | 12/2014 | Shimizu |
| 2015/0009517 A1 | 1/2015 | Shimizu |

FOREIGN PATENT DOCUMENTS

| JP | 2012-189377 | 10/2012 |
|---|---|---|
| JP | 2013-099022 | 5/2013 |
| JP | 2013-099023 | 5/2013 |

OTHER PUBLICATIONS

U.S. Appl. No. 14/509,343, filed Oct. 8, 2014.

* cited by examiner

*Primary Examiner* — Reena Aurora
(74) *Attorney, Agent, or Firm* — Cooper & Dunham LLP

(57) ABSTRACT

An angle detector includes a first signal level detector to detect a sensor processed signal having a maximum signal level of a first set of sensor processed signals obtained by signal processing of multiple sensor signals, each of the multiple sensor signals having a signal level corresponding to a rotational position of a rotor of a motor having multiple coils, a signal level adjuster to adjust each signal level of the first set of the sensor processed signals to match the sensor processed signal having a maximum signal level with a first adjustment level, a signal selector to single out a selection signal from a second set of sensor processed signals adjusted by the signal level adjuster, and a phase detector to output a phase information signal in which the signal level of selection signal selected by the signal selector corresponds to a phase of the rotor.

17 Claims, 27 Drawing Sheets

FIG. 2

| INTER SECTION DETECTION SIGNAL | HIGH LEVEL (Hi) | LOW LEVEL (Low) |
|---|---|---|
| UV | U2 ≥ V2 | U2 < V2 |
| VW | V2 ≥ W2 | V2 < W2 |
| WU | W2 ≥ U2 | W2 < U2 |

FIG. 3

| INPUT CONDITION OF EACH SIGNAL | SELECTION SIGNAL X | SIGNAL PHASE (°) |
|---|---|---|
| UV = Hi, VW = WU = Low | W2 | 150 − 210 |
| UV = VW = Hi, WU = Low | V2 | −30 − 30 |
| UV = WU = Low, VW = Hi | U2 | 150 − 210 |
| UV = Low, VW = WU = Hi | W2 | −30 − 30 |
| UV = VW = Low, WU = Hi | V2 | 150 − 210 |
| UV = WU = Hi, VW = Low | U2 | −30 − 30 |

FIG. 5

| ELECTRICAL ANGLE (°) | AMPLIFICATION RATE |
|---|---|
| 90 | 1.000 |
| 60 | 0.866 |
| 54 | 0.809 |
| 48 | 0.743 |
| 42 | 0.669 |
| 36 | 0.588 |
| 30 | 0.500 |
| 24 | 0.407 |
| 18 | 0.309 |
| 12 | 0.208 |
| 6 | 0.105 |
| 0 | 0.000 |
| −6 | −0.105 |
| −12 | −0.208 |
| −18 | −0.309 |
| −24 | −0.407 |
| −30 | −0.500 |
| −36 | −0.588 |
| −42 | −0.669 |
| −48 | −0.743 |
| −54 | −0.809 |
| −60 | −0.866 |
| −90 | −1.000 |

EMBODIMENT 3

FIG. 13

| SENSOR PHASE | INPUT CONDITION OF EACH SIGNAL | SELECTION SIGNAL Y | SIGNAL PHASE (°) |
|---|---|---|---|
| 1 | CMP_V = Low, CMP_W = CMP_U = Hi | V2 | 240 – 300 |
| 2 | CMP_U = Hi, CMP_V = CMP_W = Low | U2 | 60 – 120 |
| 3 | CMP_W = Low, CMP_U = CMP_V = Hi | W2 | 240 – 300 |
| 4 | CMP_V = Hi, CMP_W = CMP_U = Low | V2 | 60 – 120 |
| 5 | CMP_U = Low, CMP_V = CMP_W = Hi | U2 | 240 – 300 |
| 6 | CMP_W = Hi, CMP_U = CMP_V = Low | W2 | 60 – 120 |

FIG. 19 VARIATION EXAMPLE 1 OF EMBODIMENT 4

FIG. 21 VARIATION EXAMPLE 2 OF EMBODIMENT 4

FIG. 23 EMBODIMENT 5 ial Field

ANGLE DETECTOR, MOTOR DRIVE CONTROLLER, AND MOTOR DEVICE

CROSS-REFERENCE TO RELATED APPLICATIONS

This patent application is based on and claims priority pursuant to 35 U.S.C. §119(a) to Japanese Patent Application No. 2014-091823, filed on Apr. 25, 2014, in the Japan Patent Office, the entire disclosure of which is hereby incorporated by reference herein.

BACKGROUND

Technical Field

The present invention relates to an angle detector, a motor drive controller having the angle detector, and a motor device having the motor drive controller.

Background Art

To control rotational positions of a motor by, for example, stop control of a brushless DC motor, the rotation angle of a rotor of the motor is detected.

For a rotary encoder system, typically, a rotary encoder is connected to a rotation shaft to output two-phase pulse signals, which have phase differences of one-fourth cycle changing with the rotation angle and detect a relative rotation angle from edge detection and high/low states of the two-phase.

SUMMARY

According to the present disclosure, provided is an improved an angle detector that includes a first signal level detector to detect a sensor processed signal having a maximum signal level of a first set of sensor processed signals obtained by signal processing of multiple sensor signals, each of the multiple sensor signals having a signal level corresponding to a rotational position of a rotor of a motor having multiple coils, a signal level adjuster to adjust each signal level of the first set of the sensor processed signals to match the sensor processed signal having a maximum signal level with a first adjustment level, a signal selector to single out a selection signal from a second set of sensor processed signals adjusted by the signal level adjuster, and a phase detector to output a phase information signal in which the signal level of selection signal selected by the signal selector corresponds to a phase of the rotor.

In an another aspect of the present invention, an angle detector is provided which includes a second signal level detector to detect a peak level of a first set of sensor processed signals obtained by signal processing of multiple sensor signals and generate and output a detection level signal indicating a detected peak level, each of the multiple sensor signals having a signal level corresponding to a rotational position of a rotor of a motor having multiple coils, a signal level adjuster to adjust each signal level of all the first set of the sensor processed signals to match the signal level closest to a peak level with a second adjustment level and output as a second set of sensor processed signals, a signal selector to single out a selection signal from the second set of sensor processed signals adjusted by the signal level adjuster, and a phase detector to detect that a signal level of the selection signal selected by the signal selector has reached a threshold level corresponding to a phase of the rotor and output a phase information signal indicating a phase corresponding to the threshold level.

BRIEF DESCRIPTION OF THE SEVERAL VIEWS OF THE DRAWINGS

Various other objects, features and attendant advantages of the present invention will be more fully appreciated as the same become better understood from the detailed description when considered in connection with the accompanying drawings, in which like reference characters designate like corresponding parts throughout and wherein

FIG. 2 is a table showing intersection phase detection signals UV, VW, and WU indicating comparison results of sensor processed signals U2, V2, and W2 in the intersection phase detector 10 illustrated in FIG. 1;

FIG. 3 is a table showing signal selection conditions of the signal selector 20 illustrated in FIG. 1;

FIG. 5 is a table of electrical angle and amplitude rate of a selection signal X from the signal selector 20 illustrated in FIG. 1;

FIG. 13 is a table showing signal selection conditions of the signal level detector 180 illustrated in FIG. 12;

DETAILED DESCRIPTION

Figure 1:
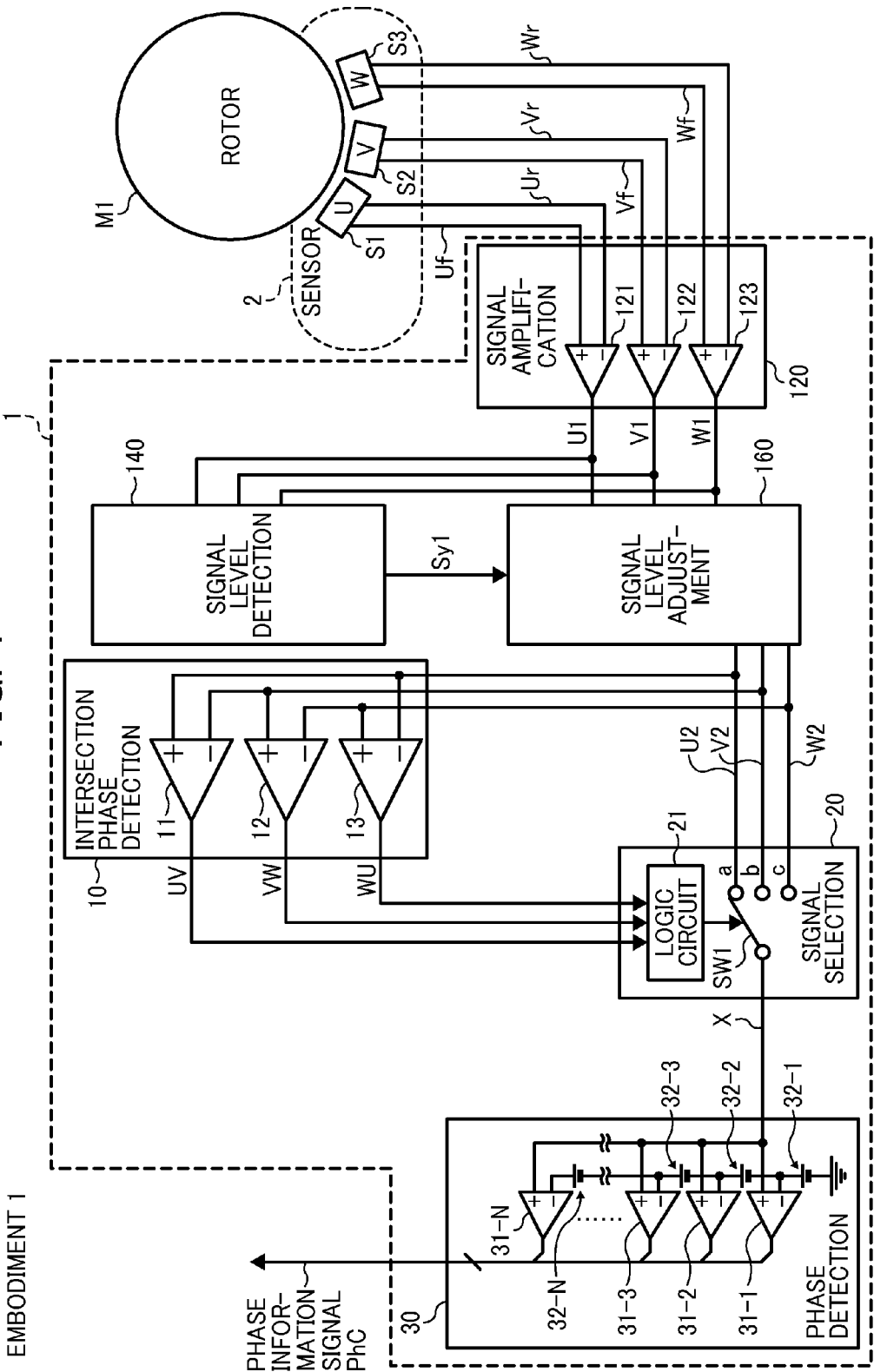
FIG. 1 is a block diagram illustrating a configuration of the angle detector 1 according to an embodiment 1 of the present invention together with a motor M1 and a sensor circuit 2.

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

According to the present invention, an angle detector is provided which is able to detect the rotational position of the rotor of a motor with a high precision.

Embodiment 1

FIG. 1 is a block diagram illustrating a configuration of an angle detector 1 according to the embodiment 1 of the present disclosure together with a motor M1 and a sensor circuit 2. In FIG. 1, the angle detector 1 includes a signal amplifier 120, a first signal level detector 140, a signal level adjuster 160, an intersection phase detector 10, a signal selector 20, and a phase detector 30. The signal amplifier 120 has three differential amplifiers 121 to 123. The signal selector 20 has a logic circuit 21 and a switch SW1. The phase detector 30 has a multiple number n of comparators 31-1 to 31-N and a multiple number n of comparators 32-1 to 32-N.

In FIG. 1, the motor M1 includes, for example, a brushless DC motor and the sensor circuit 2 is arranged around the rotor of the motor M1. The sensor circuit 2 has sensors S1 to S3 and detects the rotation angles of U phase, V phase, and W phase of the motor M1 set with an electrical angle shift (for example, 120°) by each sensor of S1 to S3. The sensors S1 to S3 are, for example, magnetic sensors formed of Hall elements, which detect magnetic flux density changing with the rotation of the motor M1. The sensors S1, S2, and S3 of the sensor circuit 2 generate the detection signals Uf, Vf, and Wf of the magnetic flux density of the U phase, the V phase, and the W phase and their reversed-phase signals Ur, Vr, and Wr, respectively, and input those into the signal amplifier 120.

In the signal amplifier 120, the differential amplifier 121 conducts differential amplification of the detection signal Uf input into a non-inverting input terminal and a reversed-phase signal Ur input into an inverting input terminal to generate a sensor processed signal U1 indicating the differential amplification result. The differential amplifier 122 conducts differential amplification of the detection signal Vf input into a non-inverting input terminal and a reversed-phase signal Vr input into an inverting input terminal to generate a sensor processed signal V1 indicating the differential amplification result. The differential amplifier 123 conducts differential amplification of the detection signal Wf input into a non-inverting input terminal and a reversed-phase signal Wr input into an inverting input terminal to generate a sensor processed signal W1 indicating the differential amplification result. The signal amplifier 120 outputs a first set of sensor processed signals U1, V1, and W1 into the signal level detector 140 and the signal level adjuster 160.

The signal level detector 140 compares each signal level of the sensor processed signals U1, V1, and W1 and detects the sensor processed signal having a signal closest to the signal level (peak level) of the peak value during rotation among the sensor processed signals U1, V1, and W1. The signal level detector 140 outputs a detection level signal Sy1 indicating the signal level of the resultant sensor processed signal to the signal level adjuster 160.

The signal level adjuster 160 adjusts the signal level of each sensor processed signal U1, V1, and W1 at the same signal amplification rate to match the signal level of the resultant sensor processed signal of the signal level detector 140 with the first adjustment level. The first adjustment level is a preset signal level described later. The signal level adjuster 160 outputs a second set of sensor processed signals U2, V2, and W2 adjusted from the sensor processed signals U1, V1, and W1 into the intersection phase detector 10 and the signal selector 20.

In the intersection phase detector 10, a comparator 11 compares the signal level of the sensor processed signal U2 with the sensor processed signal V2 to generate an intersection phase detection signal UV indicating the phase (timing) of the intersection of the sensor processed signals U2 and V2. A comparator 12 generates an intersection phase detection signal VW indicating the phase of the intersection of the sensor processed signals V2 and W2 by comparing the sensor processed signals V2 and W2 in the same manner as the comparator 11. A comparator 13 generates an intersection phase detection signal WU indicating the phase of the intersection of the sensor processed signals W2 and U2 by comparing the sensor processed signals W2 and U2 in the same manner as the comparator 11.

FIG. 2 is a table showing intersection phase detection signals UV, VW, and WU indicating the comparison results of the sensor processed signals U2, V2, and W2 in the intersection phase detector 10 illustrated in FIG. 1. As illustrated in FIG. 2, the comparator 11 illustrated in FIG. 1 generates an intersection phase detection signal UV having a high level (Hi) when the signal level of the sensor processed signal U2 is equal to or greater than the signal level of the sensor processed signal V2. To the contrary, the comparator 11 generates an intersection phase detection signal UV having a low level (Low) when the signal level of the sensor processed signal U2 is less than the signal level of the sensor processed signal V2. The comparators 12 and 13 illustrated in FIG. 1 generate binary intersection phase detection signals VW and WU, respectively, according to FIG. 2 in the same manner as in the comparator 11. As described above, the intersection phase detector 10 compares every pair of the signals among the sensor processed signals U2, V2, and W2 and generates the intersection phase detection signals UV, VW, and WU indicating the phase of the intersection of each pair. The comparators 11, 12, and 13 of the intersection phase detector 10 output the intersection phase detection signals UV, VW, and WU, respectively, to the signal selector 20.

FIG. 3 is a table showing signal selection conditions of the signal selector 20 illustrated in FIG. 1. In the signal selector 20 illustrated in FIG. 1, the sensor processed signals U2, V2, and W2 are input into terminals a, b, c, respectively, of a switch SW1 and the logic circuit 21 switch-controls the terminals a, b, and c of the switch SW1 based on the intersection phase detection signals UV, VW, and WU. According to the input conditions of the intersection phase detection signals UV, VW, and WU illustrated in FIG. 3, the signal selector 20 illustrated in FIG. 1 outputs a single selection signal X, which is selected from the sensor processed signals U2, V2, and W2, to the phase detector 30.

In the phase detector 30 illustrated in FIG. 1, the power supplies 32-1 to 32-N are connected serially and generate multiple threshold levels by individually generated voltages. The comparator 31-$n$ (n is 1, 2, . . . , N) compares the selection signal X with the threshold level of the power supply 32-$n$ and outputs the binary signal of high level when the selection signal X is equal to or greater than the threshold level. To the contrary, the comparator 31-$n$ outputs the binary signal of low level when the selection signal X is less than the threshold level. The phase detector 30 outputs each resultant binary signal of all the comparators 31-1 to 31-N as the phase information signal PhC indicating that the motor M1 has rotated to a predetermined angle. As described above, the phase detector 30 detects that the signal level of the selection signal X has reached the threshold level corresponding to the predetermined phase of the rotor of the motor M1 by the comparators 31-1 to 31-N.

In the angle detector 1 configured as described above, the phase information of the rotor of the motor M1 can be detected based on the sensor processed signals U2, V2, W2 as described below.

Figure 4:
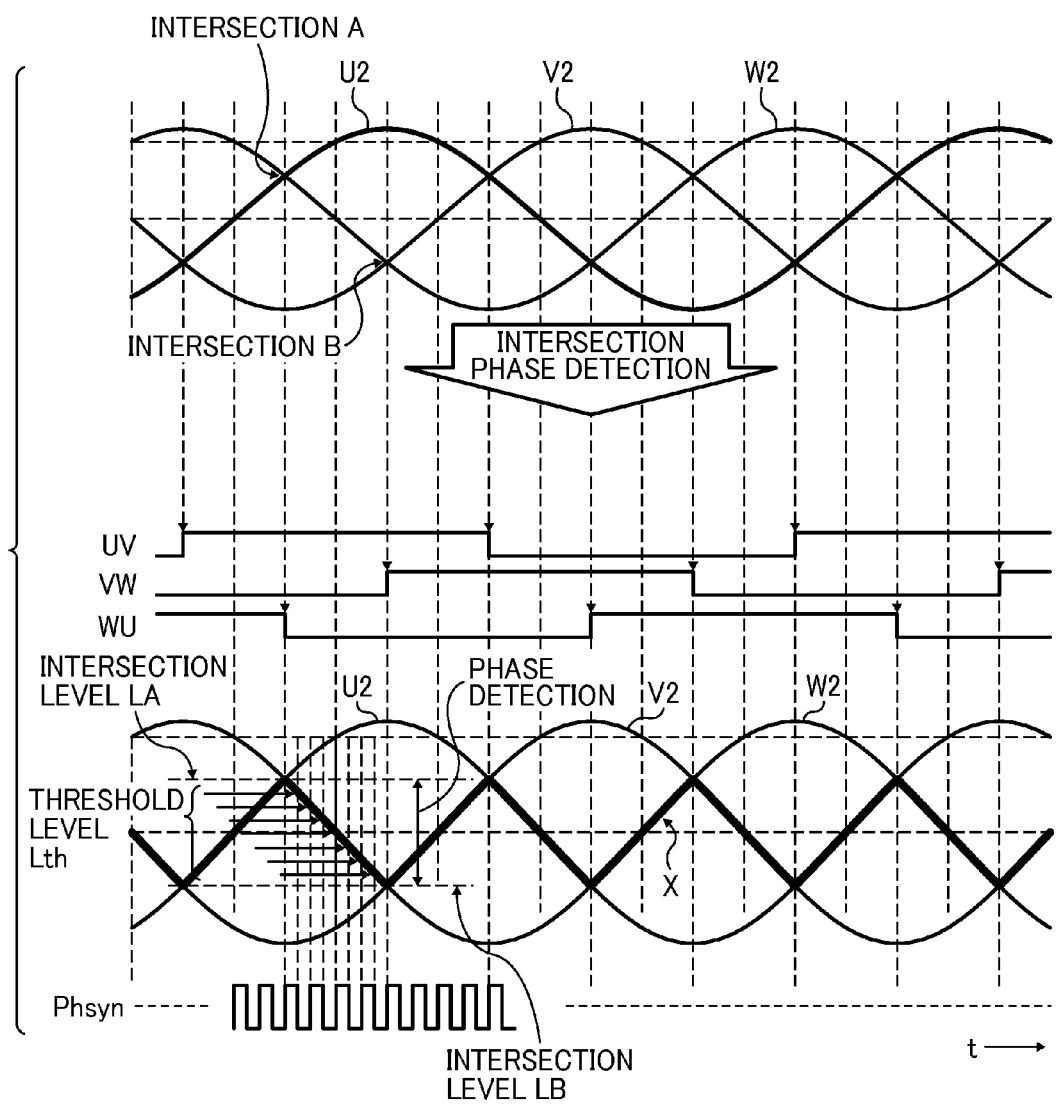
FIG. 4 is a timing diagram of signals indicating operation states of the angle detector 1 illustrated in FIG. 1.

FIG. 4 is a timing diagram of signals indicating operation states of the angle detector 1 illustrated in FIG. 1.

In FIG. 4, the sensor processed signals U2, V2, and W2 from the sensors S1, S2, and S3 are represented by sine waves (or any waveform identical or similar to the sine waves) and the U phase, the V phase, and the W phase of the sensors S1 to S3 are set with an electrical angle shift of 120° therebetween.

By using the intersection phase detector 10, the intersection phase detection signals UV, VW, and WU are obtained as the comparison results between the sensor processed signals U2, V2, and W2 as illustrated in FIG. 2. Thereafter, according to the input conditions illustrated in FIG. 3, the signal selector 20 obtains the selection signal X selected from the sensor processed signals U2, V2, and W2 for each phase section between the intersections of each sensor processed signal U2, V2, and W2. The thus-obtained selection signal X is combined so that the combined continuous signal in time is as illustrated in the bold line on the lower part of FIG. 4. As illustrated in FIG. 3, the selection signal X is ideally consisted of (1) a period of the section of 60° from the sine wave phase of 150° to 210° of the sensor processed signal W2,
(2) a period of the section of 60° from the sine wave phase of −30° to 30° of the sensor processed signal V2,
(3) a period of the section of 60° from the sine wave phase of 150° to 210° of the sensor processed signal U2,
(4) a period of the section of 60° from the sine wave phase of −30° to 30° of the sensor processed signal W2,
(5) a period of the section of 60° from the sine wave phase of 150° to 210° of the sensor processed signal V2, and
(6) a period of the section of 60° from the sine wave phase of −30° to 30° of the sensor processed signal U2. Each section of 60° has more linearity than 60° sections of from the sine wave phase of 30° to 90°, from the sine wave phase of 90° to 150°, from the sine wave phase of 210° to 270°, and from the sine wave phase of 270° to 310°. In FIG. 4, the intersection level LA is the signal level of the intersections of the sensor processed signals U2, V2, and W2 having larger signal levels than the zero cross level as the reference level. The intersection level LB is the signal level of intersections of the sensor processed signals U2, V2, and W2 having smaller signal levels than the zero cross level. The horizontal arrows for the selection signal X represent the multiple threshold levels Lth's. The angle detector 1 detects that the selection signal X has reached the predetermined threshold level and switches the binary of the phase information signal Phsyn.

FIG. 5 is a table of the electrical angle and the amplitude rate of the selection signal X from the signal selector 20 illustrated in FIG. 1. For example, if the phase detector 30 divides the range between the electrical angle −30° and 30° of the selection signal X into ten by 6°, the relation between the amplitude and the electrical angle is as illustrated in FIG. 5. However, the amplification rate is normalized under the setting that the amplitude center level of the selected sensor processed signals U2, V2, and W2 is zero (zero cross level) and the amplitude at the electrical angle of 90° is 1. The phase detector 30 determines each predetermined threshold level by each amplitude rate to the sine wave amplitude of the selection signal X according to FIG. 5. Incidentally, since the electrical angles −30° and 30° can be detected by the intersection phase detection signals UV, VW, and WU, the threshold levels corresponding to those are not necessarily set.

Figure 6:
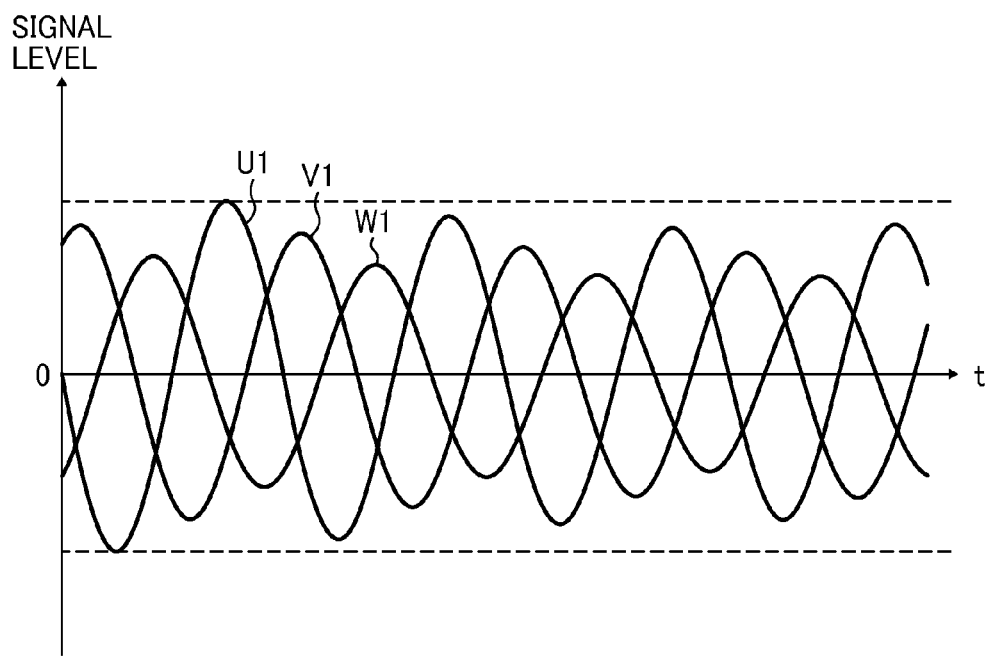
FIG. 6 is waveforms indicating variation of the amplitude of the signal level to time change of the sensor-processed signals U1, V1, and W1 illustrated in FIG. 1.

FIG. 6 is waveforms indicating variations of the amplitude of the signal level to time change of the sensor processed signals U1, V1, and W1 illustrated in FIG. 1 As illustrated in FIG. 6, each sensor processed signal U1, V1, and W1 has an amplitude variation due to production tolerance of the motor M1 and the sensors S1 to S3. The amplitude variation of the sensor processed signals U1, V1, and W1, includes (1) amplitude variation per motor being a magnetic flux variation due to individual differences of the motor M1, (2) amplitude variation per magnetic pole due to magnetization variation of each magnetic pole inside the motor M1, and (3) amplitude variation per sensor caused by individual differences of each sensor of S1 to S3.

(1) the amplitude variation per motor is caused by generation of different magnetic fluxes for each motor M1 when the motor M1 rotates, which shifts the amplitudes of the sensor processed signals U1, V1, and W1 for each of the motor M1. Due to the amplitude variation per motor, the signal level of the intersections of each sensor processed signal is possibly closer to zero cross level than to the threshold level corresponding to the particular phase, in which case, it is not possible to detect that the signal level has reached the corresponding threshold level, resulting in detection error.

(2) The amplitude variation per magnetic pole fluctuates the amplitudes of the sensor processed signals U1, V1, and W1 per magnetic pole of the motor M1 having multiple magnetic poles. As a consequence, the amplitude of each sensor processed signal U1, V1, and W1 have variations within a rotation cycle of the motor M1. Due to the amplitude variation per magnetic pole, the signal levels of the intersections of each sensor processed signal fluctuate per rotation cycle of the motor M1, thereby degrading the accuracy of the phase detection illustrated in FIG. 4.

(3) The amplitude variation per sensor is caused by production tolerance such as installation error of the sensors S1 to S3 so that the amplitudes of the sensor processed signals U1, V1, and W1 vary per sensor processed signal U1, V1, and W1. Due to the amplitude variation per sensor, the signal level of the intersections of each sensor processed signal U1, V1, and W1 does not match, thereby degrading the accuracy of the phase detection operation illustrated in FIG. 4.

As described above, the amplitude variation of each sensor processed signal lowers the detection accuracy in the phase detection illustrated in FIG. 4. Since it is not possible to quantify the amplitude variation until the motor M1 starts rotation, the detection period until the motor M1 rotates one round is set to detect all the amplitude variations described above. However, by detection of all the amplitude variations by rotating the motor M1 once, the detection accuracy of the phase information in the first round of the motor M1 is not improved by the amplitude adjustment, which possibly leads to detection error. The angle detector illustrated in FIG. 1 conducts the first signal level adjustment, which is detailed later, to improve the detection accuracy in the early stage of the phase detection including the first round rotation of the motor M1.

Figure 7:
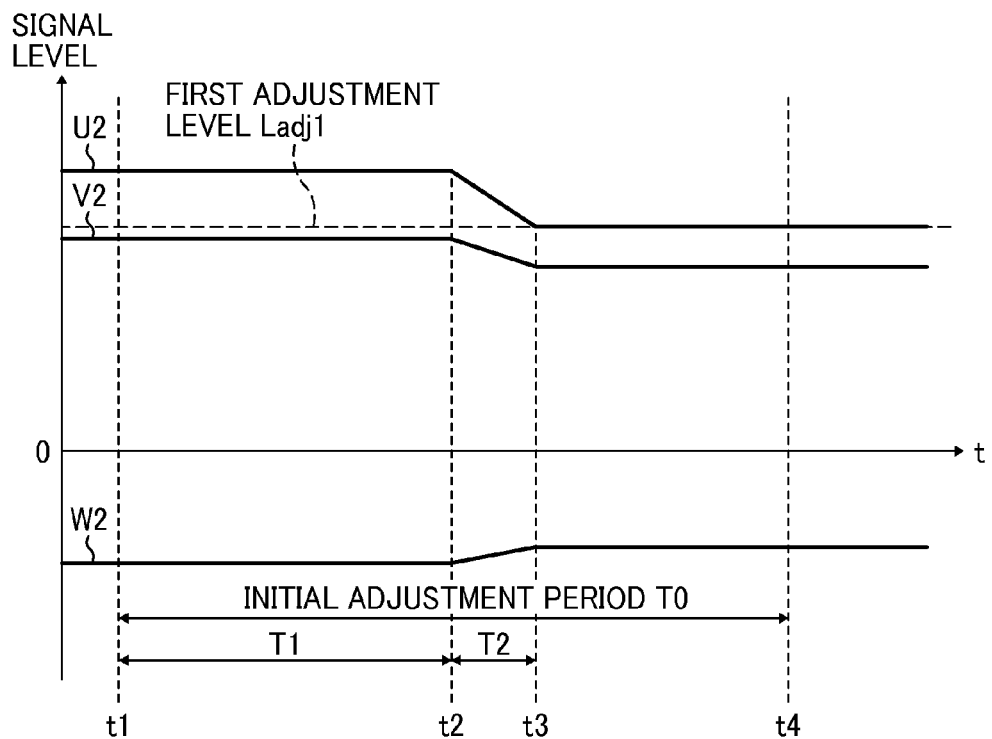
FIG. 7 is waveforms indicating the sensor processed signals U2, V2, and W2 in the first signal level adjustment of the angle detector 1 illustrated in FIG. 1.

FIG. 7 is waveform diagrams illustrating the sensor processed signals U2, V2, and W2 in the first signal level adjustment of the angle detector illustrated in FIG. 1. In FIG. 7, since the motor M1 does not rotate (i.e., before starting rotation) during the initial adjustment period T0, each sensor processed signal U1, V1, and W1 illustrated in FIG. 1 has a constant value.

In the period T1 between the time t1 and the time t2, the signal level adjustor 160 illustrated in FIG. 1 outputs the sensor processed signals U2, V2, and W2 having the same signal level as those of the sensor processed signals U1, V1, and W1. In the period T1, the signal level detector 140 compares each signal level of the sensor processed signals U1, V1, and W1 and detects the sensor processed signal U1, which is closest to the signal level of the peak value of the sensor processed signals U1, V1, and W1.

Thereafter, the signal level detector 140 outputs a detection level signal Sy1 indicating the signal level of the resultant sensor processed signal U1 to the signal level adjuster 160. In the period T2 between the time t2 and the time t3, the signal level adjuster 160 continuously adjusts the signal level of the sensor processed signal U2 in order to make the signal level of the sensor processed signal U2 closer to the first adjustment level Ladj1 based on the detection level signal Sy1. Also, the signal level adjuster 160 adjusts the other sensor processed signals V2 and W2 at the same amplification rate as the sensor processed signal U2. At the time t3, the signal level of the sensor processed signal U2 matches the first adjustment level Ladj1. The first adjustment level Ladj1 is set to the signal levels of the peak values of the ideal sensor processed signals U2, V2, and W2 illustrated in FIG. 4 with a margin against the amplitude variations, which are undetectable in the initial adjustment period T0. As a result, the sensor processed signal U2, V2, and W2 are adjusted to signals having amplitude variations less than the sensor processed signals U1, V1, and W1 at and after the time t3 and thereafter output.

Figure 8:
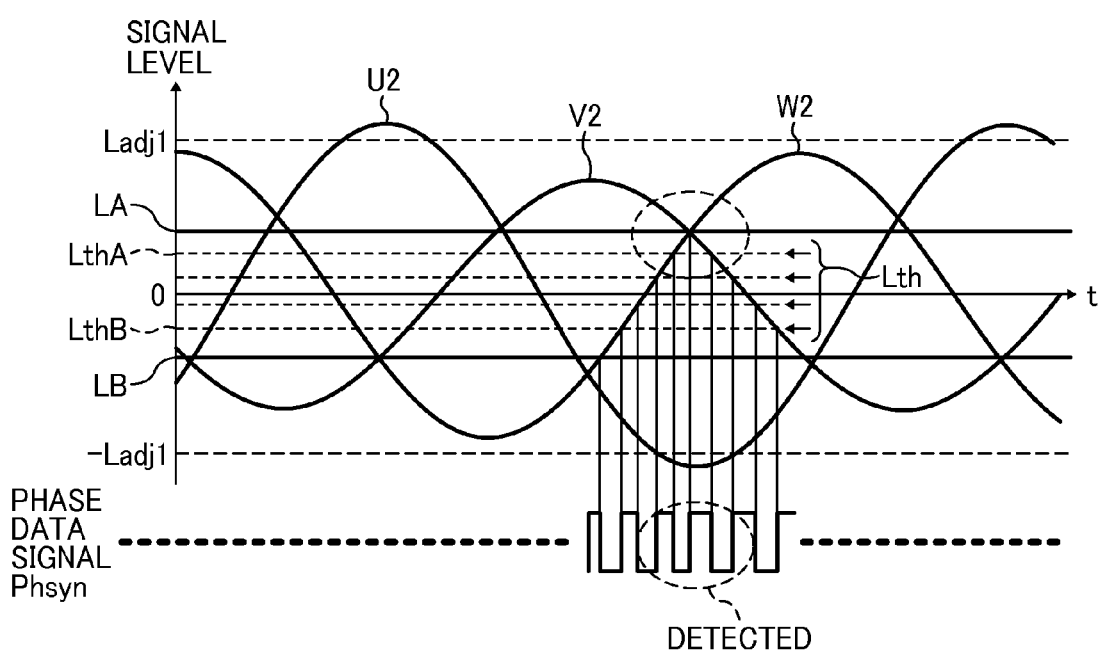
FIG. 8 is waveforms indicating the time change of the sensor processed signals U2, V2, and W2 illustrated in FIG. 1 after the first signal level adjustment illustrated in FIG. 7.

FIG. 8 is waveform diagrams illustrating the time change of the sensor processed signals U2, V2, and W2 illustrated in FIG. 1 after the first signal level adjustment illustrated in FIG. 7. In FIG. 8, the motor M1 rotates after the first signal level adjustment illustrated in FIG. 7, each sensor processed signal U2, V2, and W2 is output as a sine waveform. In the first signal level adjustment illustrated in FIG. 7, the signal level of the sensor processed signal U2, which is closest to the peak value of the sensor processed signals U2, V2, and W2, is adjusted in order to be matched with the first adjustment level Ladj1. For this reason, the peak value of the sensor processed signal U2 illustrated in FIG. 8 is by the signal level away from the peak level in the first signal level adjustment greater than the first adjustment level Ladj1. The first adjustment level Ladj1 is set with a margin against the detection error of this peak value.

The first adjustment level Ladj1 is set with a margin against the detection error of the peak level in addition to the amplification variation per magnetic pole and the amplification variation per sensor. Specifically, the first adjustment level Ladj1 is set to be a signal level at which the intersection level LA is greater than the threshold level LthA, which is the maximum of the multiple threshold levels Lth's. Accordingly, the detection errors of the phase detection is subdued.

According to the angle detector 1 relating to the embodiment 1 configured as described above, the angle detector 1 generates and outputs the phase information signal PhC based on the multiple sensor signals Uf, Vf, and Wf having each own signal level corresponding to the rotational position of the rotor of the motor M1 having multiple coils.

The angle detector 1 includes a signal level detector 140, a signal level adjuster 160, a signal selector 20, and a phase detector 30. The signal level detector 140 detects the signal level of the signal closest to the peak level being as the signal level of the peak value of the sensor processed signals U1, V1, and W1 and generates and outputs the detection level signal indicating the detected signal level. The signal level adjuster 160 adjusts across the signal levels of the multiple sensor processed signals U1, V1, and W1 in order to match the detected signal level with the predetermined adjustment level Ladj1 and outputs as the multiple sensor processed signals U2, V2, and W2. The signal selector 20 selects a single selection signal X among the multiple sensor processed signals U2, V2, and W2 adjusted by the signal level adjuster 160. The phase detector 30 detects that the signal level of the selection signal X selected by the single selector 20 has reached the threshold level Lth corresponding to the predetermined phase of the rotor and outputs the phase information signal PhC indicating the phase corresponding to the detected threshold level.

According to the angle detector 1 of the embodiment 1, the angle detector 1 detects the sensor processed signal having a signal level closest to the peak level of the sensor processed signals U1, V1, and W1 and conducts the first signal level adjustment. By this adjustment, the signal levels of the sensor processed signals U1, V1, and W1 are adjustable before the motor M1 starts rotation. Accordingly, the rotational position of the rotor of a motor is detected with high accuracy.

By adjusting across the signal levels of the sensor processed signals U2, V2, and W2 to the first adjustment level 1, the amplitude variation per motor is removed from the sensor processed signals U2, V2, and W2 before the motor M1 starts rotation. Therefore, in the phase detection similar to those illustrated in FIG. 4, the sensor processed signals U2, V2, and W2 illustrated in FIG. 8 improve the detection accuracy from the early stage including the first rotation of the motor M1.

The sensors S1 to S3 being as the magnetic sensors that detect the rotor of the motor M1 generally use Hall elements and the magnetic flux generated by the rotation of a motor is sine wave in most cases. That is, the signals from the magnetic sensors are sine waves in most cases. However, the magnetic flux generated upon rotation of the rotor and received at a fixed magnetic sensor is not always a clean sine wave as illustrated in FIG. 4 but a distorted sine wave in some cases. In addition, due to magnetic saturation occurring when the sensing magnetic flux surpasses the tolerance of the magnetic sensor, the outputs by the magnetic sensor are saturated so that the output becomes like a trapezoidal wave in some cases. To the contrary, the angle detector 1 detects the phase in a portion where the wave form of two adjacent intersections of each sensor signal is close to a straight line, for example, a portion having a higher gradient (e.g., −30° to 30° of a sine wave phase), that is, a significantly straight line portion. For example, the angle detector 1 is capable of conducting multiple phase detection with high accuracy when used for sections of signal electrical angles between −60° to 60° and 120° to 240° of a sine wave or a wave form close thereto. Even in the case of such a wave form, the angle detector 1 conducts the first signal level adjustment by, for example, detecting the sensor signal having a signal level with the maximum difference to the reference level such as zero cross level as the signal closest to the peak level of each sensor signal. As the method of identifying the signal closest to the peak value during rotation of each sensor signal, the zero cross level is not necessarily set as the reference. For example, the signal having the maximum value is selected by detecting each sensor signal of each phase by an analogue digital converter ADC. Since the signal level of the sensor signal having the maximum value of each sensor signal before rotation is closest to the peak level during rotation in any case, the signal level is subject to be matched to the first adjustment level Ladj1. The signal level having the maximum value is the absolute value regardless of positive or negative sign.

In FIG. 3, the selection signal X is in the section of from −30° to 30° or the section of from 150° to 210° of a sine wave phase of each signal sensor signal U2, V2, and W2 and forms a continuous signal even when the phase section is switched and the selected sensor signal are changed. Furthermore, the synthesis signal becomes a Gray code in the end since in the phase information signal PhC from the phase detector 30, the binary signals of the adjacent comparison results from each comparator 31-1 to 31-N change by turns. In addition, in FIG. 5, the phase information is obtained every electrical angle of 6°, which is just an example. The present disclosure is not limited thereto. For example, it is possible to obtain phase information by separating into the amplitude rate per electrical angle of 7.5° or 3° to obtain phase information twice as much as in the case of 6°.

Embodiment 2

Figure 9:
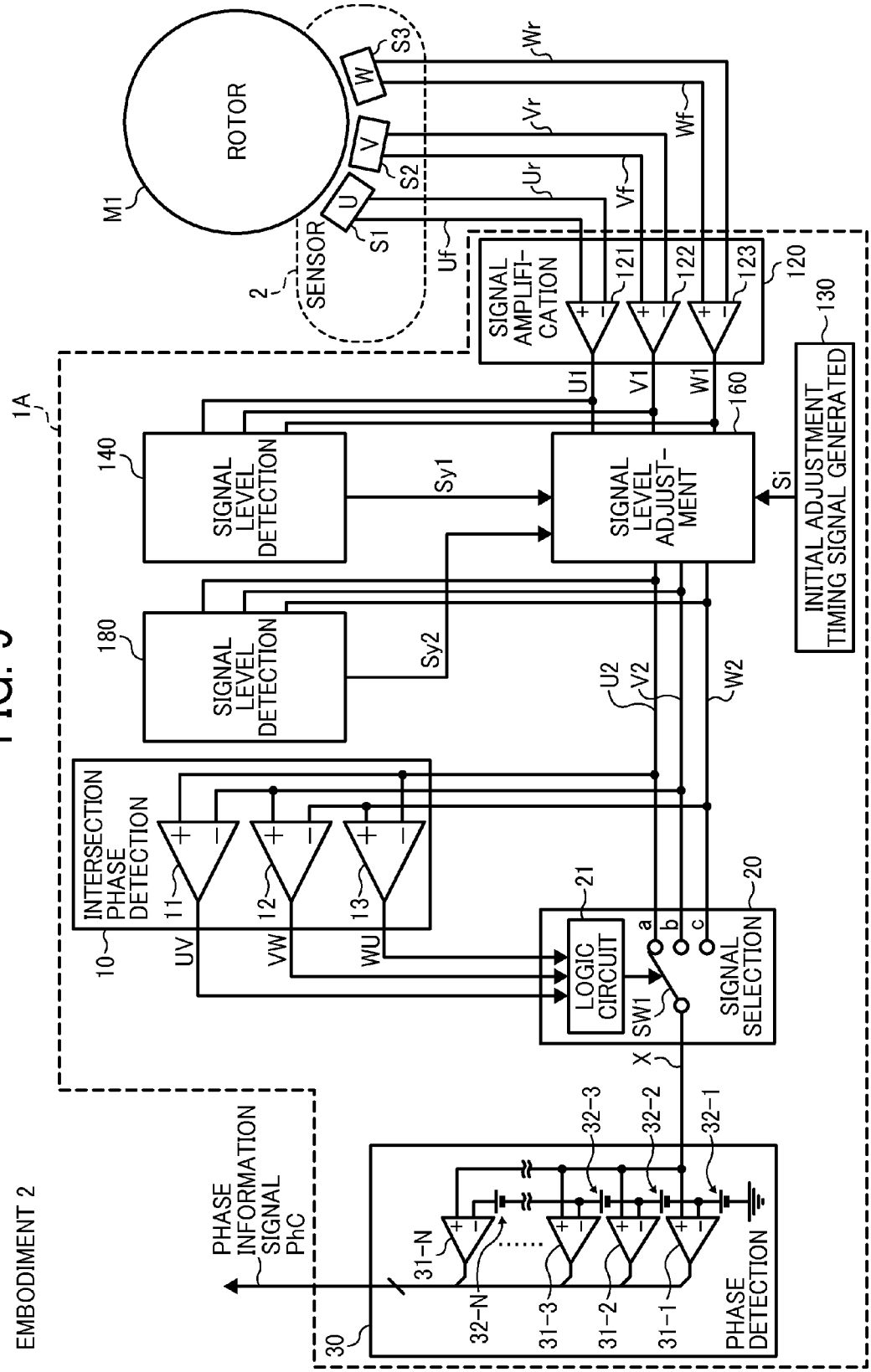
FIG. 9 is a block diagram illustrating a configuration of the angle detector 1A according to an embodiment 2 of the present invention together with the motor M1 and the sensor circuit 2.

FIG. 9 is a block diagram illustrating a configuration of the angle detector 1A according to an embodiment 2 of the present disclosure together with the motor M1 and the sensor circuit 2. The angle detector 1A relating to the embodiment 2 further conducts second signal level adjustment upon starting rotation of the motor following the first signal level adjustment in the same manner as in the embodiment 1. Accordingly, the detection error of rotation phase is removed step by step to improve the detection accuracy. The angle detector 1A relating to the embodiment 2 further has an initial adjustment timing signal generation circuit 130 and a second signal level detector 180 in comparison with the angle detector 1 of the embodiment 1. These differences are described below.

In FIG. 9, the initial adjustment timing signal generation circuit 130 sets the same initial adjustment period T0 as in FIG. 7. The initial adjustment timing signal generation circuit 130 generates an initial adjustment timing signal Si indicating the start of the initial adjustment period when starting the initial adjustment period T0 and outputs the signal to the signal level adjuster 160. In addition, the initial adjustment timing signal generation circuit 130 generates an initial adjustment signal Si indicating the completion of the initial adjustment period when the initial adjustment period T0 is finished and outputs the signal to the signal level adjuster 160.

The second signal level detector 180 detects the peak levels of sensor processed signals U2, V2, and W2 and outputs a peak level signal Sy2 indicating the peak level of the sensor processed signals U2, V2, and W2 to the signal level adjuster 160.

The signal level adjuster 160 validates one of the inputs of the detection level signal Sy1 and the peak level signal Sy2 from the signal level detectors 140 and 180, respectively, based on the initial adjustment timing signal Si and switches between the first signal level adjustment and the second signal level adjustment. The signal level adjuster 160 conducts the first signal level adjustment as in FIG. 7 until the initial adjustment timing signal Si indicating the completion of the initial adjustment period is input. After the initial adjustment timing signal Si indicating the completion of the initial adjustment period is input, the signal level adjuster 160 adjusts the signal levels of the sensor processed signals U2, V2, and W2 at a same signal amplification rate in order that the peak level of the peak level signal Sy2 is matched with the second adjustment level Ladj2.

The angle detector 1A configured as described above adjusts the signal level of the sensor processed signal U2, V2, W2 as described below.

Figure 10:
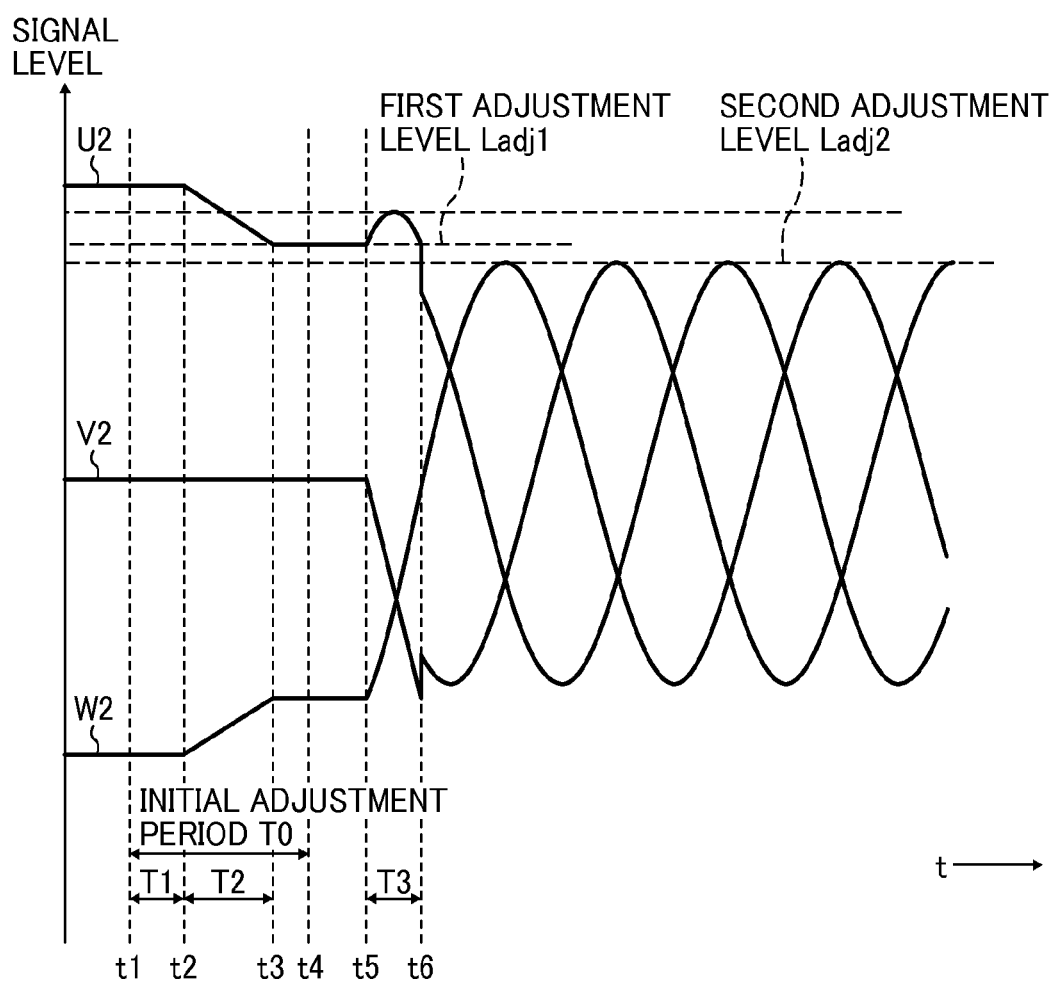
FIG. 10 is waveforms indicating the sensor processed signals U2, V2, and W2 in the first and the second signal level adjustment of the angle detector 1A illustrated in FIG. 9.

FIG. 10 is waveforms indicating the sensor processed signals U2, V2, and W2 in the first and the second signal level adjustment of the angle detector 1A illustrated in FIG. 9. In FIG. 10, the angle detector 1A conducts the first signal level adjustment during the initial adjustment period T0 in the same manner as illustrated in FIG. 7. At the time t4, the initial adjustment timing signal generation circuit 130 outputs the initial adjustment timing signal Si indicating the completion of the initial adjustment period to the signal level adjuster 160. The signal level adjuster 160 switches to the second signal level adjustment based on the initial adjustment timing signal Si. During the period T3 between the time t5 and the time t6, the signal level detector 180 detects the peak level of the sensor processed signal U2 and outputs the peak level signal Sy2 indicating the peak level to the signal level adjuster 160. The signal level adjuster 160 adjusts the signal level of each sensor processed signals U2, V2, and W2 at the same signal amplification rate in order to match the signal level of the sensor processed signal U2 with the second adjustment level Ladj2 at the time t6.

In the first signal adjustment, since the motor M1 is not in rotation (i.e., before starting rotation), the peak level of each sensor processed signal U2, V2, and W2 is not correctly detected. Therefore, the first adjustment level Ladj1 is set with a margin against the detection error of the peak level. The second adjustment level Ladj2 is set by removing the margin against the detection error of the peak level from the first adjustment level Ladj1. As a result, the peak level detection error is removed from the sensor processed signals U2, V2, and W2 in the second signal level adjustment, so that the phase detection accuracy of the angle detector 1A is improved prior to the time t6.

According to the angle detector 1A relating to the embodiment 2 configured as described above, the second signal level adjustment is conducted after the first signal level adjustment, so that the signal levels of the sensor processed signals U2, V2, and W2 are adjusted step by step before the starting of the rotation of the motor M1. Accordingly, the detection accuracy of the rotation phase of the motor M1 is improved in earlier stage.

Since the peak levels of the sensor processed signals U2, V2, and W2 are detected and each signal level is adjusted to the second adjustment level by the second signal level adjustment, the peak level detection error in the first signal level adjustment can be removed.

Variation Example of Embodiment 2

Figure 11:
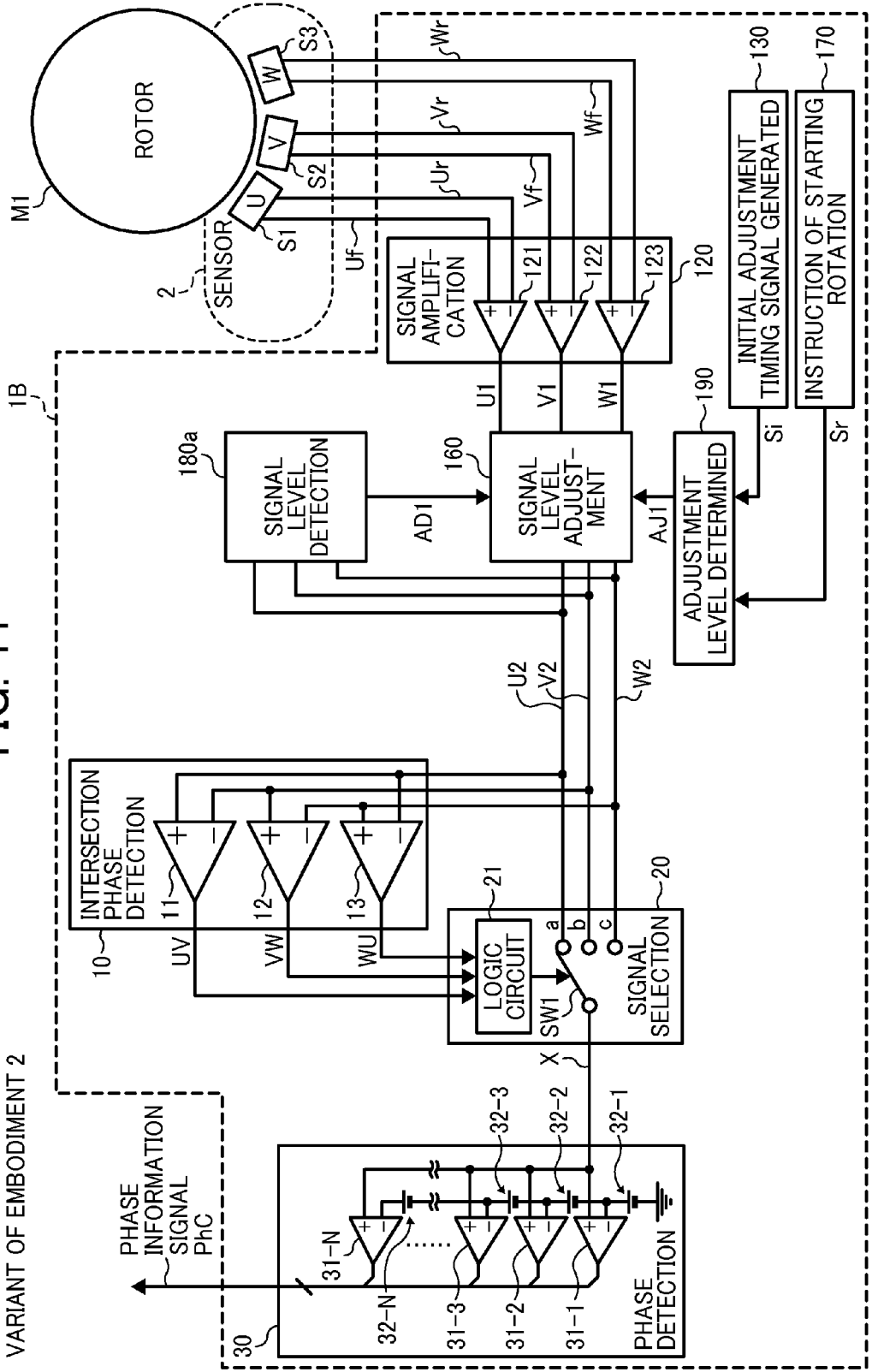
FIG. 11 is a block diagram illustrating a configuration of the angle detector 1B according to a variation example of the embodiment 2 of the present invention together with the motor M1 and the sensor circuit 2.

FIG. 11 is a block diagram illustrating a configuration of the angle detector 1B relating to a variation example of the embodiment 2 together with the motor M1 and the sensor circuit 2. The first and the second signal level adjustment in embodiment 2 can be conducted by commonalizing the two signal level detectors 140 and 180. In comparison with the angle detector 1A relating to the embodiment 2, the angle detector 1B relating to a variation example of the embodiment 2 has a signal level detector 180a instead of the two signal level detectors 140 and 180. In comparison with the angle detector 1A, the angle detector 1B relating to the variation example of the embodiment 2 has a rotation starting instruction circuit 170 and an adjustment level setting unit 190. These differences are described below.

In FIG. 11, the signal level detector 180a is commonalized circuit of the two signal level detectors 140 and 180 illustrated in FIG. 9. The signal level detector 180a detects the sensor processed signal having a signal level closest to the peak level of the sensor processed signals U2, V2, and W2 and outputs the a detection signal AD1 indicating the signal level of the resultant sensor processed signal to the signal level adjuster 160.

The rotation starting instruction circuit 170 generates the rotation starting instruction signal Sr indicating the timing of instruction of starting of rotation of the motor M1 and outputs the signal to the adjustment level setting unit 190. The initial adjustment timing signal generation circuit 130 outputs the initial adjustment timing signal Si to the adjustment level setting unit 190.

The adjustment level setting unit 190 switches the first adjustment level Ladj1 and the second adjustment level Ladj2 based on the initial adjustment timing signal Si and the rotation starting instruction signal Sr and outputs to the signal level adjuster 160 as an adjustment level setting signal AJ1. The adjustment level setting unit 190 switches the first adjustment level Ladj1 to the second adjustment level Ladj2 upon the input of the initial adjustment timing signal Si indicating the completion of the initial adjustment period and the input of the rotation starting instruction signal Sr and thereafter outputs the adjustment level setting signal AJ1.

The signal level adjuster 160 computes the signal amplification rate to match the signal level of the detection signal AD1 with the adjustment level of the adjustment level setting signal AJ1. The signal level adjuster 160 adjusts the signal level of the sensor processed signals U1, V1, and W1 at the computed signal amplification rate and outputs the sensor processed signals U2, V2, and W2.

That is, the angle detector 1B relating to the variation example of the embodiment 2 configured as described above is capable of conducting the second signal level adjustment following the first signal level adjustment in the same manner as in the angle detector 1A relating to the embodiment 2. The circuit area is reduced more than that illustrated in FIG. 9 due to the configuration where each signal level in the first and the second signal level adjustment is detected by the common signal level detector 180a.

Embodiment 3

Figure 12:
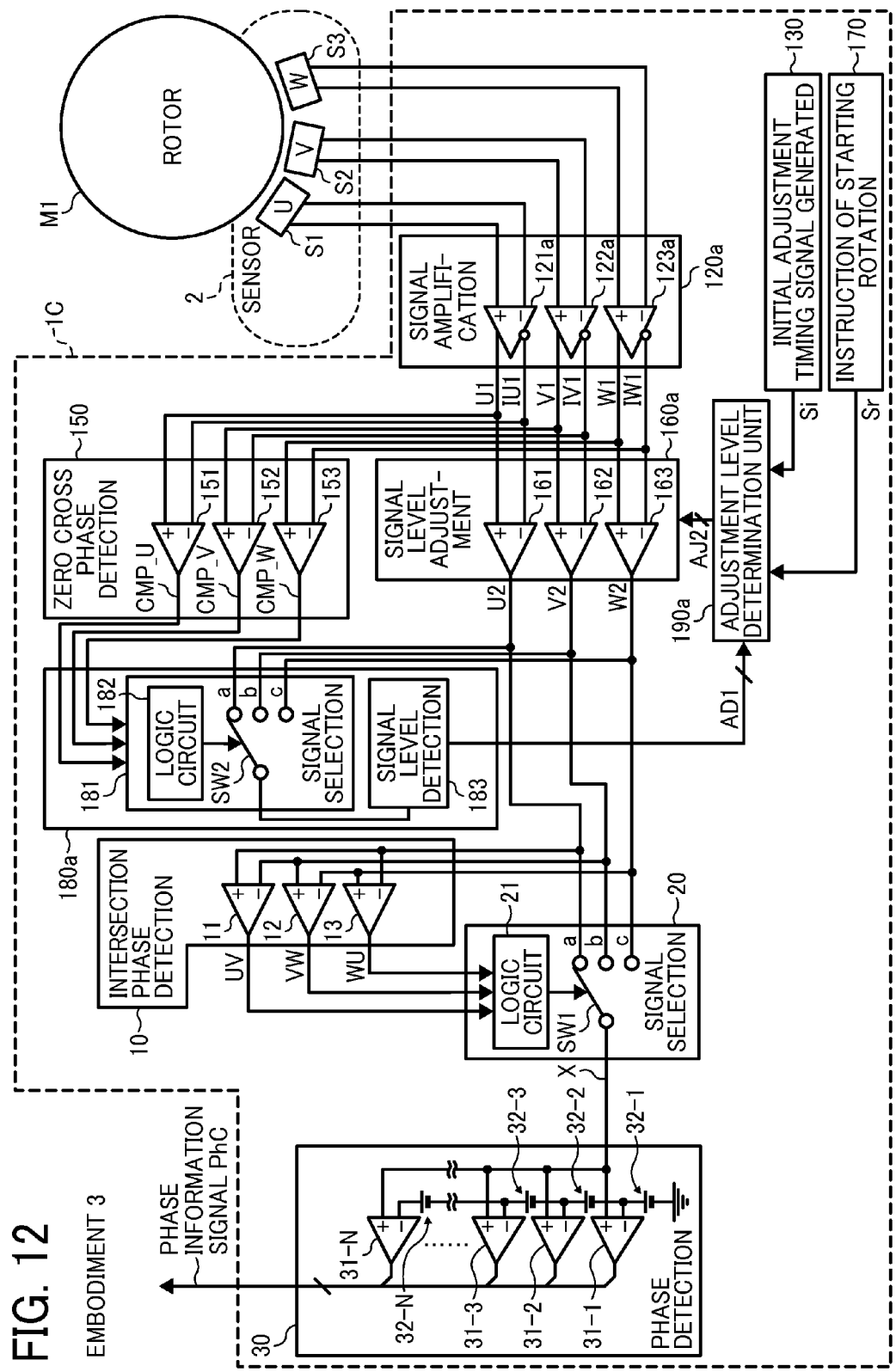
FIG. 12 is block diagrams illustrating a configuration of the angle detector 1C according to an embodiment 3 of the present invention together with a motor M1 and a sensor circuit 2.

FIG. 12 is a block diagram illustrating a configuration of the angle detector 1C relating to embodiment 3 together with the motor M1 and the sensor circuit 2. The angle detector 1C relating to the embodiment 3 further conducts a third signal level adjustment following the first signal level adjustment and the second signal level adjustment. In addition, the angle detector 1C detects the signal closest to the peak level among the sensor processed signals using the signal logic in the first signal level adjustment. In comparison with the angle detector 1A relating to the embodiment 1, the angle detector 1C relating to the embodiment 3 has a zero cross phase detector 150. In comparison with the angle detector 1B, the angle detector 1C has a signal amplifier 120a, a signal level adjuster 160a, a rotation start instruction circuit 170, and an adjustment level setting unit 190a instead of the signal amplifier 120, the signal level adjuster 160, and the adjustment level setting unit 190. Moreover, the angle detector 1C has a signal level detector 180a instead of the two signal detectors 140 and 180. These differences are described below.

Figure 29:
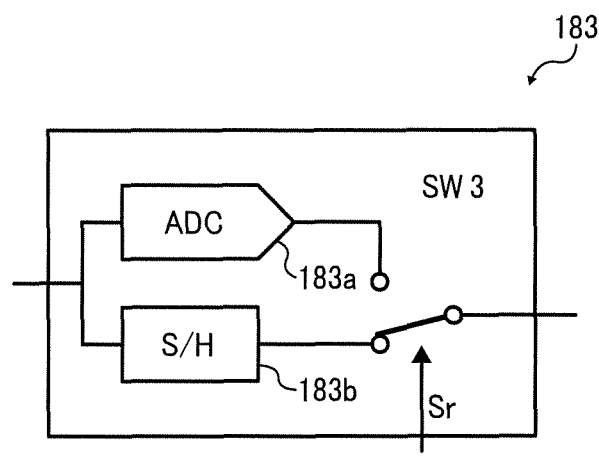
FIG. 29 is a diagram illustrating an example of the communalized circuit according to an embodiment of the present disclosure.

In FIG. 12, the signal amplifier 120a has differential amplifiers 121a to 123a instead of the differential amplifiers 121 to 123 in comparison with the signal amplifier 120 illustrated in FIG. 1. The zero cross phase detector 150 has comparators 151 to 153. The signal level adjuster 160a has differential amplifiers 161 to 163. The signal level detector 180a has a signal selection circuit 181 and a signal level detection circuit 183. The signal Sr is input into the level detection circuit 183 from the rotation starting instruction circuit 170. The signal selector 181 has a logic circuit 182 and a switch SW2. FIG. 29 is a diagram illustrating the level detection circuit 183. The level detection circuit 183 has an AD converter 183a, a sampling hold S/H183b, and a switch SW3 switched by the signal Sr from the rotation starting instruction circuit 170. The circuit area is reduced in comparison with that illustrated in FIG. 9 by the configuration in which the common signal level detector 180a detects each signal level in the first and the second signal level adjustment. For example, although the switch SW3 is newly provided, the logic circuit 182 inside the signal selection circuit 181, the switch SW2, and the input and output wiring can be shared.

The differential amplifier 121a of the signal amplifier 120a conducts differential amplification of the detection signal Uf and the reversed-phase signal Ur as in the differential amplifier 1 illustrated in FIG. 1 and generates the sensor processed signal U1 of the differential amplification result and a reversed-phase signal IU1 thereof. The differential amplifier 122a conducts differential amplification of the detection signal Vf and the reversed-phase signal Vr as in the differential amplifier 121a and generates the sensor processed signal V1 of the differential amplification result and a reversed-phase signal IV1 thereof. The differential amplifier 123a conducts differential amplification of the detection signal Wf and the reversed-phase signal Wr as in the differential amplifiers 121a and 122a and generates the sensor processed signal W1 of the differential amplification result and a reversed-phase signal IW1 thereof. The signal amplifier 120a outputs the sensor processed signals U1, V1, and W1 and the reversed-phase signals IU1, IV1, and IW1 thereof into the zero cross phase detector 150 and the signal level adjuster 160a.

In the zero cross phase detector 150, the comparator 151 generates a zero cross phase detection signal CMP_U having a high level when the signal level of the sensor processed signal U1 input into the non-inverting input terminal is equal to or greater than the signal level of the reversed-phase signal IU1 input into the inverting input terminal. On the other hand, the comparator 151 generates the zero cross phase detection signal CMP_U having a low level when the signal level of the sensor processed signal U1 is less than the signal level of the reversed-phase signal IU1.

The comparator 152 generates a zero cross phase detection signal CMP_V having a high level when the signal level of the sensor processed signal V1 input into the non-inverting input terminal is equal to or greater than the signal level of the reversed-phase signal IV1 input into the inverting input terminal. On the other hand, the comparator 152 generates the zero cross phase detection signal CMP_V having a low level when the signal level of the sensor processed signal V1 is less than the signal level of the reversed-phase signal IV1.

The comparator 153 generates a zero cross phase detection signal CMP_W having a high level when the signal level of the sensor processed signal W1 input into the non-inverting input terminal is equal to or greater than the signal level of the reversed-phase signal IW1 input into the inverting input terminal. On the other hand, the comparator 153 generates the zero cross phase detection signal CMP_W having a low level when the signal level of the sensor processed signal W1 is less than the signal level of the reversed-phase signal IW1. As described above, the zero cross phase detector 150 detects the zero cross phase (timing) when the sensor processed signals U2, V2, and W2 pass the zero cross level serving as the reference level and generates the resultant zero cross phase detection signals CMP_U, CMP_V, and CMP_W. The zero cross phase detector 150 outputs each zero cross phase detection signal CMP_U, CMP_V, and CMP_W into the signal selection circuit 181 of the signal level detector 180a.

In the signal level adjuster 160a, the differential amplifier 161 conducts differential amplification of the sensor processed signal U1 input into the non-inverting input terminal and a reversed-phase signal IU1 input into the inverting input terminal to generate a sensor processed signal U2 indicating the differential amplification result. The differential amplifier 162 conducts differential amplification of the sensor processed signal V1 input into the non-inverting input terminal and the reversed-phase signal IV1 input into the inverting input terminal to generate a sensor processed signal V2 indicating the differential amplification result. The differential amplifier 163 conducts differential amplification of the sensor processed signal W1 input into the non-inverting input terminal and the reversed-phase signal IW1 input into the inverting input terminal to generate a sensor processed signal W2 indicating the differential amplification result. The gain of each differential amplifier 161 to 163 is set by the adjustment level setting unit 190a. The signal level adjusting unit 160a outputs the sensor processed signals U2, V2, and W2 into the signal level detector 180 as in the signal level adjuster 160.

FIG. 13 is a table showing signal selection conditions of the signal level detector 180a illustrated in FIG. 12. In the signal selection circuit 181 of the signal level detector 180a, the sensor processed signals U2, V2, and W2 are input into terminals a, b, c, respectively, of the switch SW2. The logic circuit 182 switch-controls the terminals a, b, and c of the switch SW2 based on the zero cross phase detection signals CMP_U, CMP_V, and CMP_W. According to the input conditions of the zero cross phase detection signals CMP_U, CMP_V, and CMP_W illustrated in FIG. 13, the signal selection circuit 181 illustrated in FIG. 12 outputs a selection signal Y that has selected one of the sensor processed signals U2, V2, and W2 to the signal level detection circuit 183. The signal level detection circuit 183 detects the signal level of the selection signal Y and outputs the detection signal AD1 indicating the detected signal level to the adjustment level setting unit 190a.

When no signal Sr from the rotation starting instruction circuit 170 is received, ADC180a is selected. When the rotation starting instruction signal is input, the S/H180b is selected. When the S/H180b is selected, the signal level of the selection signal Y reaches the peak level, the peak level is retained. That is, the detection signal AD1 before rotation becomes the maximum signal level (the signal level of the selection signal Y) of the U phase, V phase, and W phase. The detection signal AD1 after rotation becomes the signal level that has reached the peak level after the rotation starts.

The adjustment level setting unit 190a computes the signal amplification rate to match the signal level of the detection signal AD1 with one of the adjustment levels of the first to the third adjustment levels Ladj1 to Ladj3 and outputs the resultant setting signal AJ2 indicating the signal amplification rate of the computation result to the signal level adjuster 160a. One of the first to the third adjustment levels Ladj1 to Ladj3 is switched and set based on the initial adjustment timing signal Si and the rotation starting instruction signal Sr. The adjustment level setting unit 190a sets the first adjustment level Ladj1 until the initial adjustment timing signal Si indicating the completion of the initial adjustment period is input. The adjustment level setting unit 190a sets the second adjustment level Ladj2 after the initial adjustment timing signal Si indicating the completion of the initial adjustment period is input and the rotation starting instruction signal Sr is input. After switched to the second adjustment level Ladj2, when the signal level of the detection signal AD1 becomes the second adjustment level Ladj2, the adjustment level setting unit 190a sets the third adjustment level Ladj3, which has a particular level described later.

The signal level adjuster 160a sets the signal amplification rates of the differential amplifiers 161 to 163 to the signal amplification rate of the setting signal AJ2 based on the setting signal AJ2, adjust the sensor processed signals U1, V1, and W1, and outputs the sensor processed signals U2, V2, and W2.

In the angle detector 1C configured as described above, the signal level adjuster 160a adjusts the signal level of the sensor processed signal U2, V2, W2 as described below.

FIG. 14(a) is waveforms indicating the sensor processed signals U2, V2, and W2 in the first, the second, and the third signal level adjustment of the angle detector 1C illustrated in FIG. 12. FIG. 14(b) is timing graphs indicating the zero cross phase detection signals CMP_U, CMP_V, and CMP_W that detected the zero cross phases of the sensor processed signals U2, V2, and W2 of FIG. 14(a).

Figure 14:
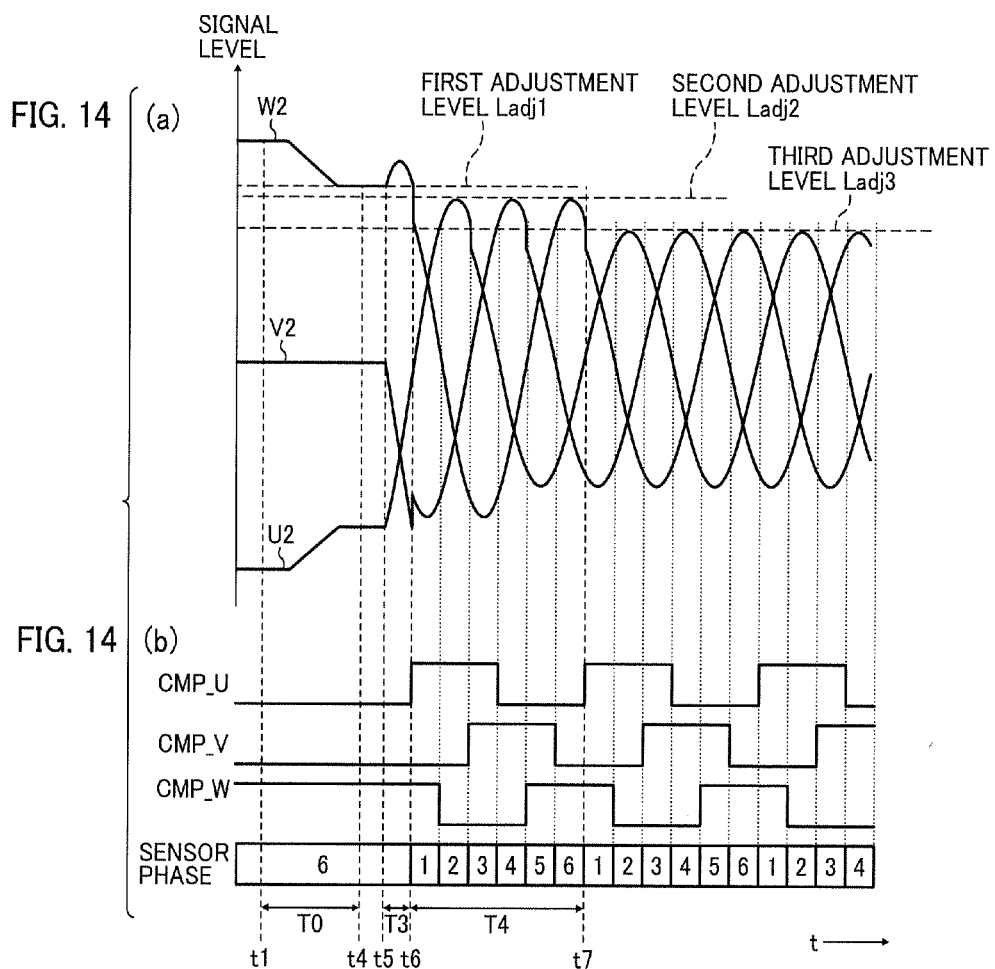
FIG. 14(a) is waveforms indicating the sensor processed signals U2, V2, and W2 in the first, the second, and the third signal level adjustment of the angle detector 1C illustrated in FIG. 12
FIG. 14(b) is timing diagrams indicating zero cross phase detection signals CMP_U, CMP_V, and CMP_W that detected zero cross phases of the sensor processed signals U2, V2, and W2 of FIG. 14(a)

In FIG. 14, the angle detector 1C conducts the first signal level adjustment during the initial adjustment period T0 in the same manner as illustrated in FIG. 10. The signal level detector 180a illustrated in FIG. 12 detects the sensor processed signal closest to the peak level of the sensor processed signals U1, V1, and W1, using the signal logic of the zero cross phase detection signals CMP_U, CMP_V, and CMP_W.

FIG. 15(a) is waveforms indicating one cycle of the sensor-processed signals U2, V2, and W2 illustrated in FIG. 12 FIG. 15(b) is timing graphs indicating the zero cross phase detection signals CMP_U, CMP_V, and CMP_W that detected the zero cross phases of the sensor processed signals U2, V2, and W2 of FIG. 15(a).

Figure 15:
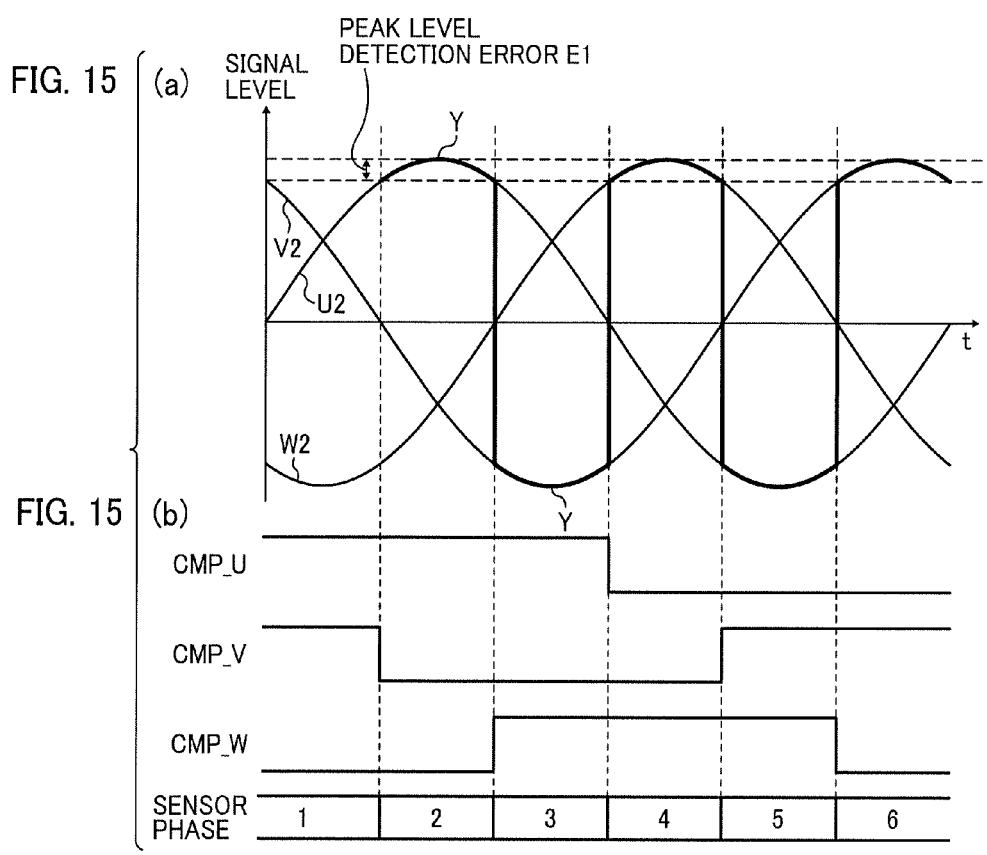
FIG. 15(a) is waveforms indicating one cycle of each of the sensor processed signals U2, V2, and W2 illustrated in FIG. 12
FIG. 15(b) is timing diagrams indicating zero cross phase detection signals CMP_U, CMP_V, and CMP_W that detected zero cross phases of the sensor processed signals U2, V2, and W2 of FIG. 15(a)

In FIG. 15, the sensor processed signals U2, V2, and W2 are separated into the six phase sections (sensor phases) regulated by the signal logic of the zero cross phase detection signals CMP_U, CMP_V, and CMP_W as illustrated in FIG. 13. The sensor processed signals U2, V2, and W2 are contained in either one of the corresponding sections irrespective of the rotational positions of the rotor of the motor M1. As illustrated in FIG. 15, in each phase section of each sensor phase, only one sensor processed signal among the sensor processed signals U2, V2, and W2 has the peak level. The signal level detector 180a selects the selection signal Y from the sensor processed signals U1, V1, and W1 as illustrated in FIG. 13 and detects the sensor processed signal closest to the peak level among the sensor processed signals U1, V1, and W1.

Here, where the phase of the sensor processed signal detected as described above is in each phase section is determined after the motor M1 start rotation. For this reason, the signal level of the selection signal Y selected in the initial adjustment period T0 contains a peak level detection error E1 as illustrated in FIG. 1 Therefore, the first adjustment level Ladj1 is set with a margin containing the peak level detection error E1 in the first signal level adjustment. Incidentally, the first adjustment level Ladj1 is set with a margin for the amplification variation per magnetic pole and a margin for the amplification variation per sensor, which cannot be determined in the initial adjustment period T0 yet.

In FIG. 14, the second signal level adjustment as illustrated in FIG. 10 starts from the time t5 at which the motor M1 start rotation. The actual peak level is detectable after the rotation of the motor M1 starts. To this detection, the second adjustment level Ladj2 where the margin for the peak level detection error is removed from the first adjustment level Ladj1 is set. The adjustment level setting unit 190a sets across the signal amplification rate of each of the sensor processed signals U2, V2, and W2 in order to match the peak level detected during the period T3, which is after the motor M1 has started rotation, with the second adjustment level Ladj2.

Next, the angle detector 1C starts the third signal level adjustment from the time t6. The adjustment level setting unit 190a detects the peaks levels of the sensor processed signals U2, V2, and W2 based on the detection signal AD1 and computes the signal amplification rate in such a manner that the corresponding peak level matches the third adjustment level Ladj3. In the third signal level adjustment, the adjustment level setting unit 190a sets the computed signal amplification rate for each of the differential amplifiers 161 to 163. The third adjustment level Ladj3 is set after removing the amplification variation per sensor from the second adjustment level Ladj2. As a result, the signal level adjuster 160a is capable of adjusting each signal level to remove the amplification variation per sensor from the sensor processed signals U2, V2, and W2.

According to the angle detector 1C relating to the embodiment 3 configured as described above, the second signal level adjustment is conducted after the first signal level adjustment, and thereafter, the third signal level adjustment follows. By this adjustment, the signal levels of the sensor processed signals U2, V2, and W2 are adjusted step by step before the motor M1 starts rotation. Accordingly, the detection accuracy of the rotation phase of the motor M1 is improved in an earlier stage.

It is possible to remove the amplification variation per sensor from the sensor processed signals U2, V2, and W2 by detecting the peak levels of the sensor processed signals U2, V2, and W2 and adjusting the signal levels individually to the third adjustment level. Furthermore, by continuously conducting the third signal level adjustment through time, each peak level in one cycle of the rotation of the motor M1 is adjusted to the same signal level. For example, for each of the sensor processed signals U2, V2, and W2, the signal level is continuously adjusted in order that the minimum peak level of the peak levels in the one cycle of the rotation of the motor M1 is changed to an ideal peak level. Therefore, the impact of the amplification variation per magnetic pole against the phase detection is reduced.

In the first signal level adjustment, the signal level adjuster 160a selects the selection signal Y illustrated in FIG. 13 based on the zero cross phase detection signals CMP_U, CMP_V, and CMP_W. For this reason, the sensor processed signal closest to the peak level among the sensor processed signals U1, V1, and W1 is easily detected. Furthermore, it is possible to precisely estimate the peak level detection error E1.

Variation Example 1 of Embodiment 3

FIG. 16(a) is waveforms indicating the sensor processed signals U2, V2, and W2 in the first, the second, and the third signal level adjustment in the variation example 1 of embodiment 3. FIG. 16(b) is timing graphs indicating the zero cross phase detection signals CMP_U, CMP_V, and CMP_W that detected the zero cross phases of the sensor processed signals U2, V2, and W2 of FIG. 16(a).

Figure 16:
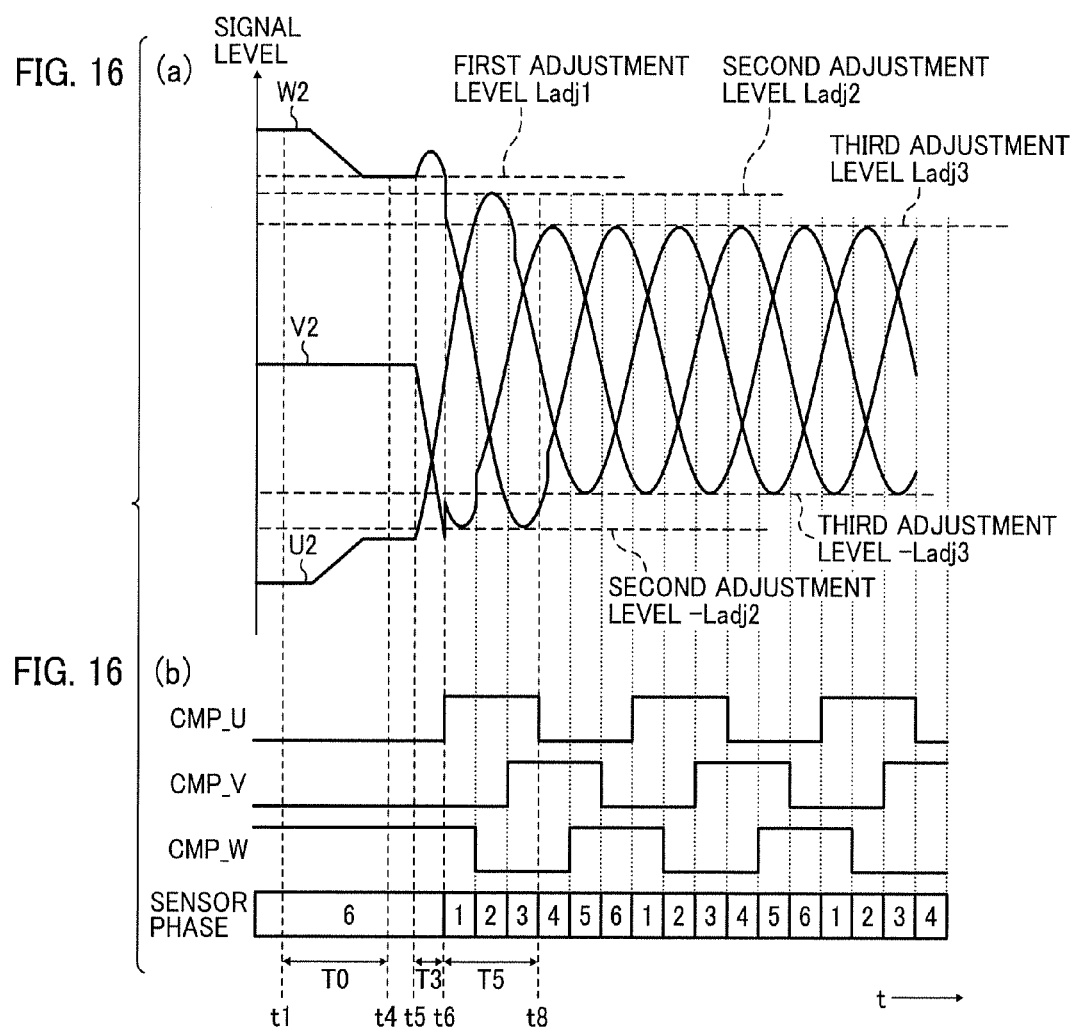
FIG. 16(a) is waveforms indicating the sensor processed signals U2, V2, and W2 in the first, the second, and the third signal level adjustment operations according to a variation example 1 of the embodiment 3
FIG. 16(b) is timing diagrams indicating zero cross phase detection signals CMP_U, CMP_V, and CMP_W that detected zero cross phases of the sensor processed signals U2, V2, and W2 of FIG. 16(a)

In the second and the third signal level adjustment illustrated in FIG. 14, while setting the second and the third level Ladj2 and Ladj3 on the same side of the first adjustment level Ladj1 with reference to the zero cross level, the signal level of the sensor processed signals U2, V2, and W2 are adjusted. However, as illustrated in FIG. 16, with reference to the zero cross level, it is possible to set the second and the third level Ladj2 and Ladj3 on both sides with reference to the zero cross level. In such a case, the period from the second signal level adjustment to the third level adjustment is shortened from the period T4 illustrated in FIG. 14 to the period T5 illustrated in FIG. 16.

As described above, by the third signal adjustment illustrated in FIG. 16, the phase detection accuracy can be improved sooner than the third signal adjustment illustrated in FIG. 14.

Variation Example 2 of Embodiment 3

FIG. 17(a) is waveforms indicating the sensor processed signals U2, V2, and W2 in the first, the second, and the third signal level adjustment in the variation example 2 of embodiment 3. FIG. 17(b) is timing graphs indicating the zero cross phase detection signals CMP_U, CMP_V, and CMP_W that detected the zero cross phases of the sensor processed signals U2, V2, and W2 of FIG. 17(a).

Figure 17:
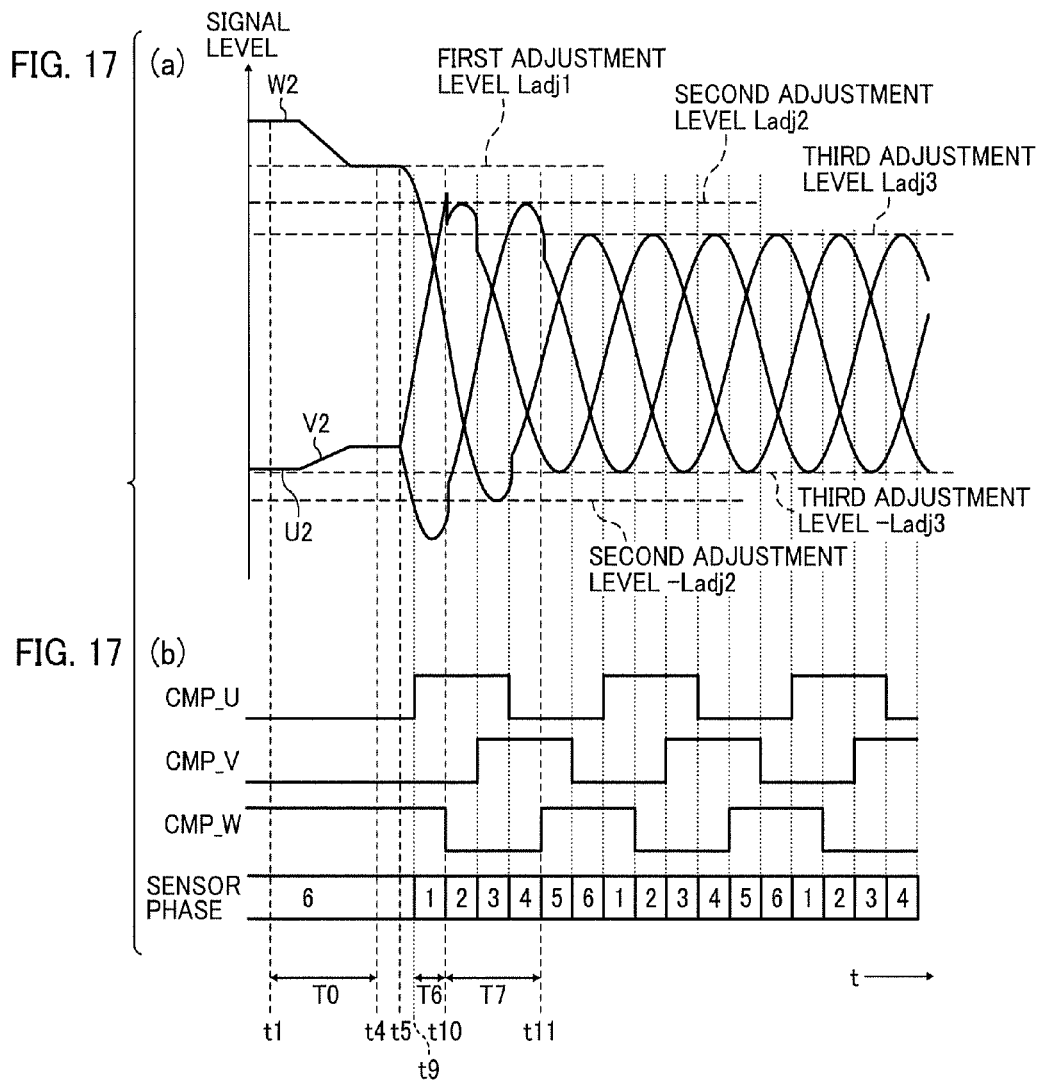
FIG. 17(a) is waveforms indicating the sensor processed signals U2, V2, and W2 in the first, the second, and the third signal level adjustment operations according to a variation example 2 of the embodiment 3
FIG. 17(b) is timing diagrams indicating zero cross phase detection signals CMP_U, CMP_V, and CMP_W that detected zero cross phases of the sensor processed signals U2, V2, and W2 of FIG. 17(a)

The second signal level adjustment illustrated in FIG. 14 and FIG. 16 is conducted at the time t6 at which the first sensor phase switching occurs after the time t5 at which the motor M1 starts rotation. However, as illustrated in FIG. 17, the sensor processed signal does not always have a peak level before the time t9 at which the phase section of the first sensor phase switching occurs after the time t5 at which the motor M1 starts rotation. Therefore, it is possible to start the second signal level adjustment from the time t10 at which the phase section of the second sensor switches for the second time after the motor M1 start rotation. Incidentally, the other signal level adjustment is conducted during the switching time of the phase section of each sensor phase as illustrated in FIG. 14 and FIG. 16.

As described above, by the third signal adjustment illustrated in FIG. 17, the signal levels of the sensor processed signals U2, V2, and W2 can be more securely matched with each adjustment level than the third signal adjustment illustrated in FIG. 14 and FIG. 16.

Accordingly, the detection accuracy of the rotation phase of the motor M1 is improved.

Embodiment 4

Figure 18:
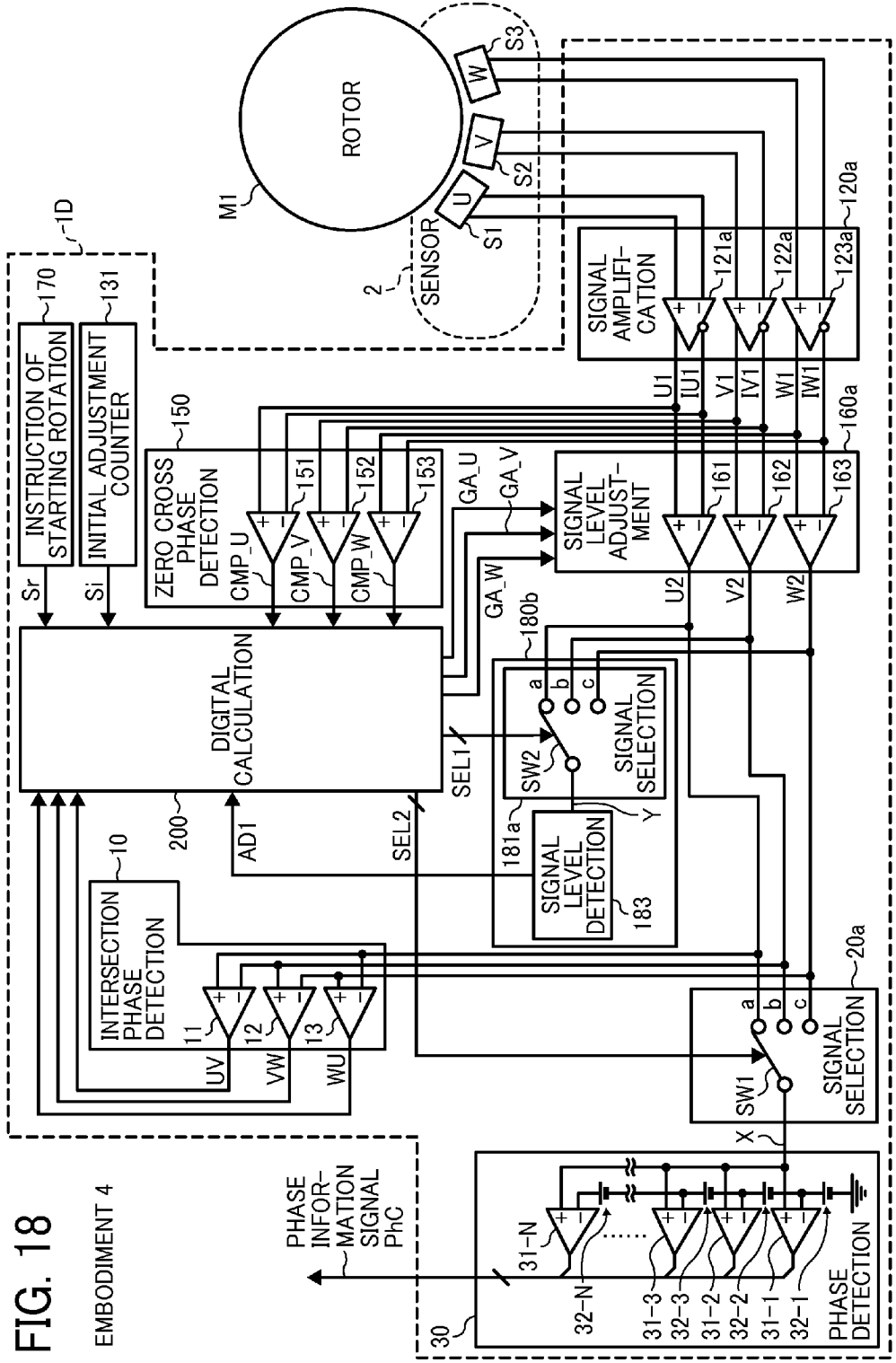
FIG. 18 is a block diagram illustrating a configuration of the angle detector 1D according to an embodiment 4 of the present invention together with the motor M1 and the sensor circuit 2.

FIG. 18 is a block diagram illustrating a configuration of the angle detector 1D relating to embodiment 4 of the present disclosure together with the motor M1 and the sensor circuit 2. In comparison with the angle detector 1C relating to the embodiment 3, the angle detector 1D relating to embodiment 4 further has a digital computing unit 200 and the signal level selection 20a and a signal level detector 180b instead of the signal level selection 20 and a signal level detector 180a. In comparison with the angle detector 1C, the angle detector 1D has an initial adjustment counter 131 instead of the adjustment level setting unit 190a and the initial adjustment timing signal generating circuit 130. These differences are described below.

In FIG. 18, the initial adjustment counter 131 counts the number of counts corresponding to the initial adjustment period as illustrated in FIG. 1 and generates the initial adjustment timing signal Si indicating the completion of the initial adjustment period. The initial adjustment timing signal Si from the initial adjustment counter and the zero cross phase detection signals CMP_U, CMP_V, and CMP_W from the zero cross phase detector 150 are input into the digital computing unit 200.

The digital computing unit 200 is formed of digital circuits and carries out an operation based on the logical operation and digital signals. The digital computing unit 200 generates a selection signal SEL1 to select the selection signal Y from the sensor processed signals U2, V2, and W2 as illustrated in FIG. 13 according to the signal logic of the zero cross phase detection signals CMP_U, CMP_V, and CMP_W and outputs the signal to a signal selection circuit 181a. The signal selection circuit 181a switch-controls the terminals a, b, and c of the switch SW2 based on the selection signal SEL1 and outputs the selection signal Y to the signal level detection circuit 183. The signal level detection circuit 183 detects the signal level of the selection signal Y and outputs the detection signal AD1 indicating the detected signal level to the digital computing unit 200.

The digital computing unit 200 selects the adjustment level for adjustment among the first adjustment level Ladj1 to the third adjustment level Ladj3 based on the initial adjustment timing signal Si and the rotation start instruction signal Sr as in the adjustment level setting unit 190a illustrated in FIG. 12. The digital computing unit 200 computes the signal amplification rate to match the signal level of the detection signal AD1 with the selected adjustment level. The digital computing unit 200 outputs the signal amplification rate setting signals GA_U, GA_V, GA_W to the differential amplifiers 161, 162, and 163, respectively, in order that the signal amplification rate of the differential amplifiers 161, 162, and 163 is set to the computed signal amplification rate calculated to each sensor processed signal U2, V2, and W2.

Furthermore, the intersection phase detection signals UV, VW, and WU from the intersection phase detector 10 are input into the digital computing unit 200. The digital computing unit 200 generates a selection signal SEL2 to select the selection signal X from the sensor processed signals U2, V2, and W2 as illustrated in FIG. 3 according to the intersection phase detection signals UV, VW, and WU and outputs the signal to the signal selector 20a.

In the angle detector 1D configured as described above, the phase information of the rotor of the motor M1 can be detected based on the sensor processed signal U2, V2, W2 as described below.

The first signal level adjustment is conducted during the initial adjustment period before completion of the number counting by the initial adjustment counter 131. The digital computing unit 200 outputs the selection signal SEL1 to select the sensor processed signal closest to the peak level among the sensor processed signals U2, V2, and W2 based on the zero cross phase detection signals CMP_U, CMP_V, and CMP_W. The signal level of the selection signal Y selected is detected by the signal level detection circuit 183 and input into the digital computing unit 200 as the detection signal AD1. The digital computing unit 200 computes the signal amplification rate in order that the detection signal AD1 input becomes the first adjustment level Ladj1 and outputs the calculation results to the signal level adjuster 160a as the signal amplification rate setting signals GA_U, GA_V, and GA_W. At this point, the signal amplification rate setting signals GA_U, GA_V, and GA_W are the same signal amplification rate.

The timing transferred to the second signal level adjustment is when the rotation of the motor M1 starts by the rotation starting instruction after the completion of a predetermined number counting by the initial adjustment counter 131. At this point, the digital computing unit 200 outputs the selection signal SEL1 to select the selection signal Y based on the zero cross phase detection signals CMP_U, CMP_V, and CMP_W as in the first signal level adjustment. In the second signal level adjustment, the signal level detector 180b detects the peak level of the selection signal Y and inputs the level to the digital computing unit 200 as the detection signal AD1. The digital computing unit 200 computes the signal amplification rate in order that the detection signal AD1 input becomes the second adjustment level Ladj2 and outputs the calculation results to the signal level adjuster 160a as the signal amplification rate setting signals GA_U, GA_V, and GA_W. At this point, the signal amplification rate setting signals GA_U, GA_V, and GA_W are the same signal amplification rate.

The third level adjustment is sequentially conducted following the second signal level adjustment. The digital computing unit 200 outputs the selection signal SEL1 to select the selection signal Y based on the zero cross phase detection signals CMP_U, CMP_V, and CMP_W as in the first and the second signal level adjustment. The signal level detector 180b detects the peak level of the selection signal Y and inputs the level to the digital computing unit 200 as the detection signal AD1. The digital computing unit 200 computes the signal amplification rate in order that the detection signal AD1 input becomes the third adjustment level Ladj3 and outputs the calculation results to the signal level adjuster 160a as one of the signal amplification rate setting signals GA_U, GA_V, and GA_W. That is, in the third signal level adjustment, the digital computing unit 200 outputs the calculation result as the signal amplification rate setting signal GA_U when the detection signal AD1 is the signal level of the sensor processed signal U2. Similarly, the digital computing unit 200 outputs the calculation result as the signal amplification rate setting signal GA_V when the detection signal AD1 is the signal level of the sensor processed signal V2. Similarly, the digital computing unit 200 outputs the calculation result as the signal amplification rate setting signal GA_W when the detection signal AD1 is the signal level of the sensor processed signal W2. In the third signal adjustment, the signal level of each sensor processed signal U2, V2, and W2 is adjusted individually.

Variation Example 1 of Embodiment 4

Figure 19:
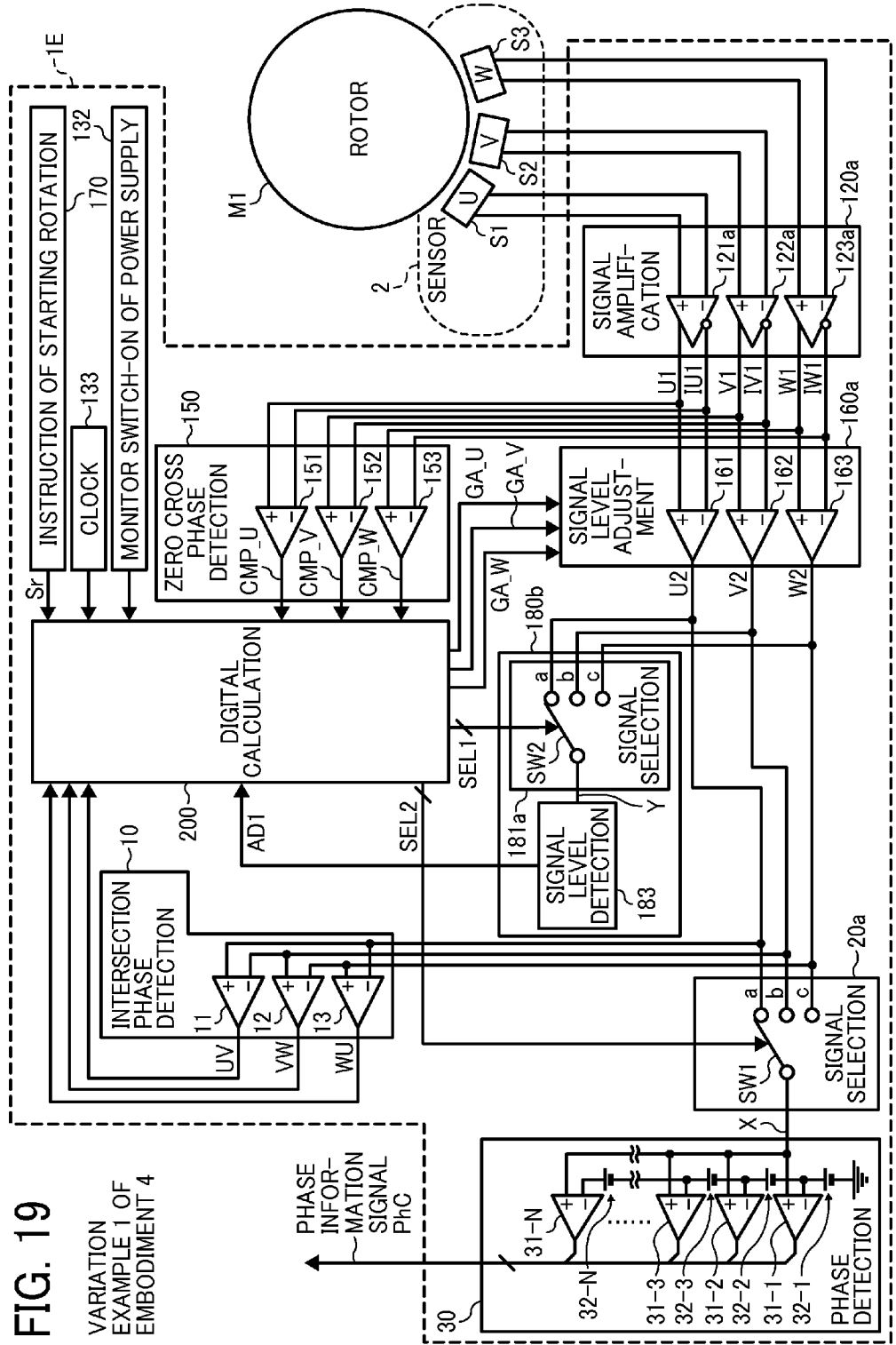
FIG. 19 is a block diagram illustrating a configuration of the angle detector 1E according to a variation example 1 of an embodiment 4 together with the motor M1 and the sensor circuit 2.

FIG. 19 is a block diagram illustrating a configuration of the angle detector 1E according to a variation example 1 of embodiment 4 together with the motor M1 and the sensor circuit 2. The angle detector 1E relating to variation example 1 of the embodiment 4 has an power rise monitoring circuit 132 and a clock circuit 133 instead of the initial adjustment timing signal generation circuit 130 in comparison with the angle detector 1D of the embodiment 4. These differences are described below.

In FIG. 19, the power rise monitoring circuit 132 detects that the voltage of an external power source has risen to a particular level and outputs a detection signal to the digital computing unit 200. The digital computing unit 200 starts the number count of the clock signal from the clock circuit 133 based on the detection signal from the power rise monitoring circuit 132 and counts up to a particular number.

Figure 20:
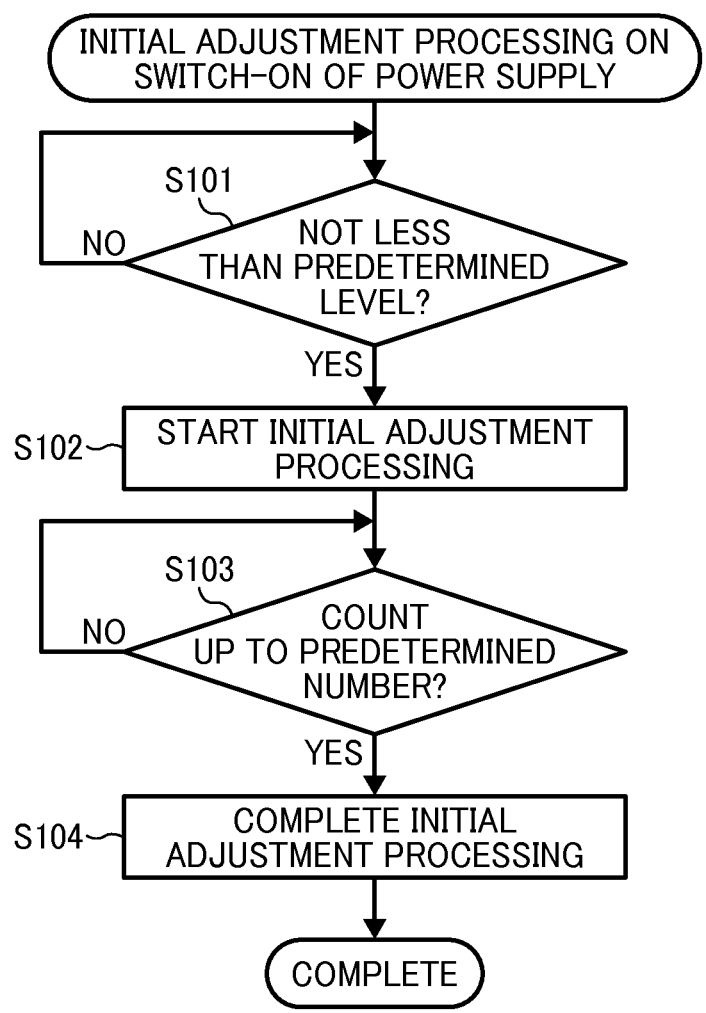
FIG. 20 is a flow chart indicating an initial adjustment processing when turning on the power of the digital computing unit 200 illustrated in FIG. 19.

FIG. 20 is a flow chart indicating an initial adjustment processing when turning on the power of the digital computing unit 200 illustrated in FIG. 19. When the power rises, the power rise monitoring circuit 132 detects whether the power is a particular level or above (Step S101). When the power is less than the level, the power rise monitoring circuit 132 continues monitoring (No to Step S101). When the power is the particular level or above, the digital computing unit 200 starts initial adjustment (Yes to Step S101). In Step S102 at which the initial adjustment starts, the digital computing unit 200 also starts the number count of the clock signal of the clock circuit 133. The digital computing unit 200 continues counting up to a particular number (No to Step S103). When the number count reaches the particular number (Yes to Step S103), the digital computing unit 200 completes the initial adjustment (Step S104). During this initial adjustment, the digital computing unit 200 conducts the first signal level adjustment.

Variation Example 2 of Embodiment 4

Figure 21:
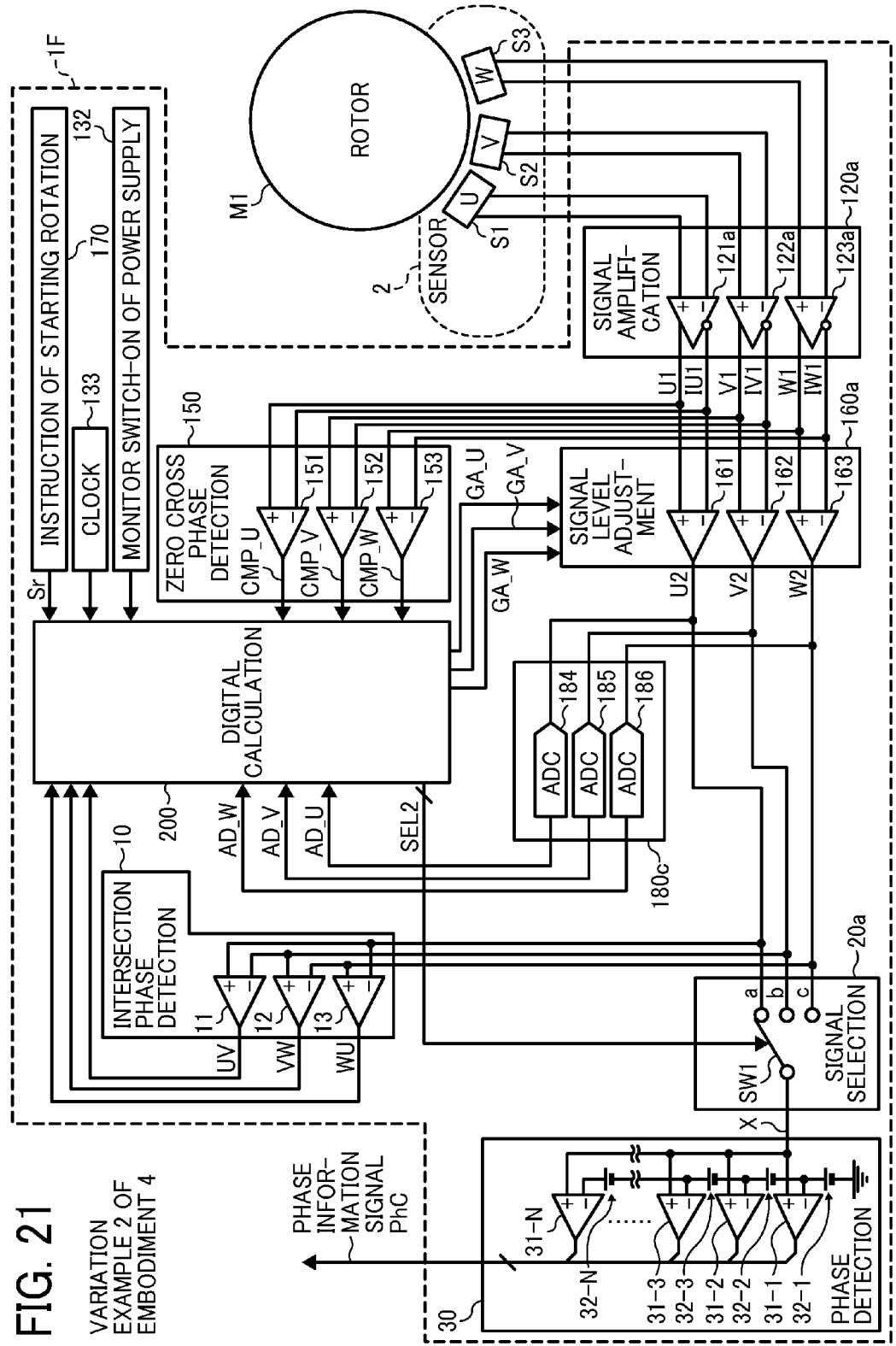
FIG. 21 is a block diagram illustrating a configuration of the angle detector 1F according to a variation example 2 of the embodiment 4 together with the motor M1 and the sensor circuit 2.

FIG. 21 is a block diagram illustrating a configuration of the angle detector 1F relating to a variation example 2 of the embodiment 4 together with the motor M1 and the sensor circuit 2. In comparison with the angle detector 1E relating to the variation example 1 of the embodiment 4, the angle detector 1F relating to the variation example 2 of the embodiment 4 has a signal level detector 180c instead of the signal level detector 180b. These differences are described below.

In FIG. 21, the signal level detector 180c is configured to have three A/D converters 184, 185, and 186. The A/D converter 184 converts the signal level of the sensor processed signal U2 to the signal AD_U and outputs to the digital computing unit 200. The A/D converter 185 converts the signal level of the sensor processed signal V2 to the signal AD_V and outputs to the digital computing unit 200. The A/D converter 186 converts the signal level of the sensor processed signal W2 to the signal AD_W and outputs to the digital computing unit 200.

FIG. 22(a) is waveforms indicating the sensor-processed signals U2, V2, and W2 illustrated in FIG. 21 FIG. 22(b) is timing graphs indicating the zero cross phase detection signals CMP_U, CMP_V, and CMP_W that detected the zero cross phases of the sensor processed signals U2, V2, and W2 of FIG. 22(a).

Figure 22:
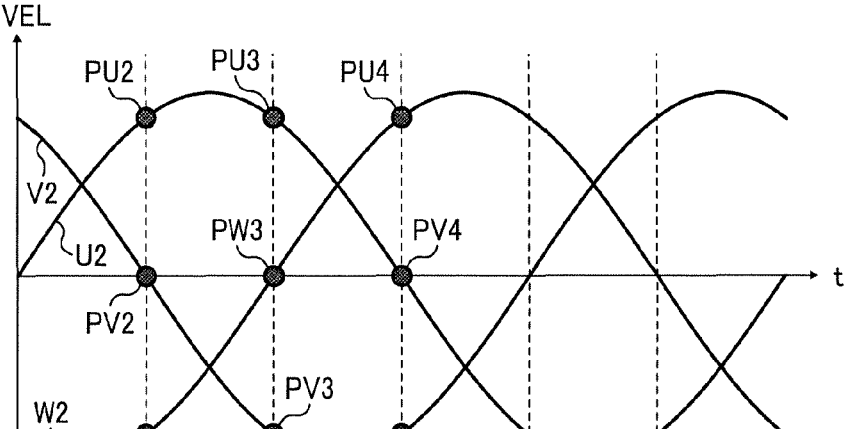
FIG. 22(a) is waveforms indicating the sensor processed signals U2, V2, and W2 illustrated in FIG. 21
FIG. 22(b) is timing diagrams indicating zero cross phase detection signals CMP_U, CMP_V, and CMP_W that detected zero cross phases of the sensor processed signals U2, V2, and W2 of FIG. 22(a)

In FIG. 22, each of the A/D converters 184 to 186 converts the signal levels of the sensor processed signals U2, V2, and W2 to digital signals. For this reason, the digital computing unit 200 is always capable of detecting the signal level of each sensor processed signal. In addition, the digital computing unit 200 can detect digital values PUn, PVn, and PWn (n=1, 2, 3, 4, 5, 6) of each digital signals AD_U, AD_V, and AD_W on switching timing of the sensor phases. In FIG. 22, each sensor processed signal U2, V2, and W2 is a sine wave with an electrical angle shift of 120° therebetween, so that the digital values PUn, PVn, and PWn has 0.866 times the peak level. Therefore, the digital computing unit 200 calculates the peak level of each detected digital value PUn, PVn, and PWn by multiplication of 1/0.866.

Embodiment 5

Figure 23:
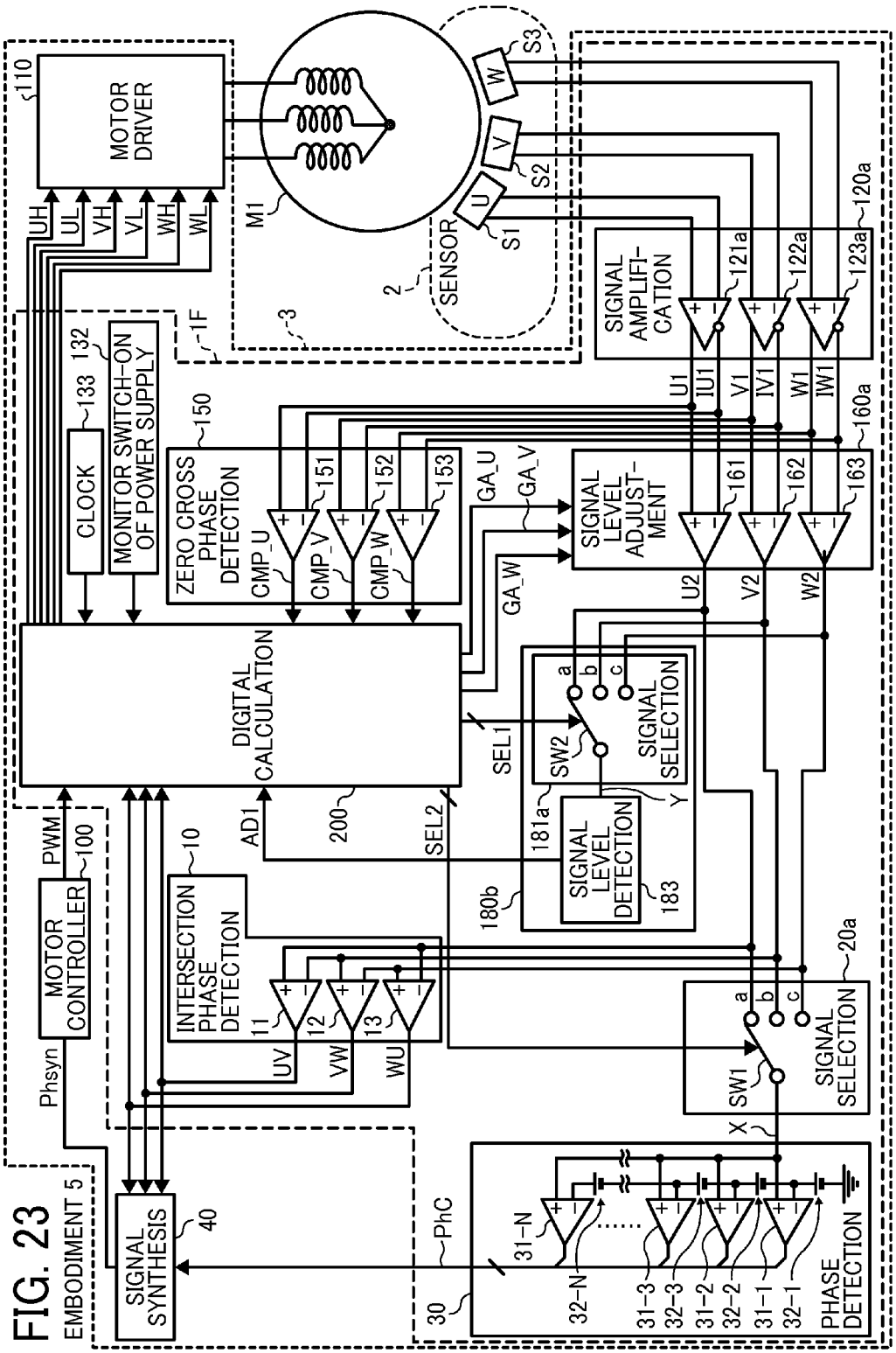
FIG. 23 is a block diagram illustrating a configuration of the motor device according to an embodiment 5 of the present invention.

FIG. 23 is a block diagram illustrating a configuration of the motor equipment according to an embodiment 5 of the present invention. In FIG. 23, the motor relating to embodiment 5 has the motor M1, the sensor circuit 2, and a motor drive controller 3. The motor drive controller 3 has the angle detector 1E relating to the embodiment 4, a signal synthesizing unit 40, a motor controller 100, and a motor driver 110. The signal synthesizing unit 40 generates a phase information signal Phsyn based on the phase information signal PhC and outputs it to the motor controller 100. The motor controller 100 generates a PWM signal based on the phase information signal Phsyn and outputs it to the motor driver 110. The motor driver 110 selectively applies a drive current to multiple motor coils based on the PWM signal of the motor controller 100 to rotate the rotor of the motor M1.

Figure 24:
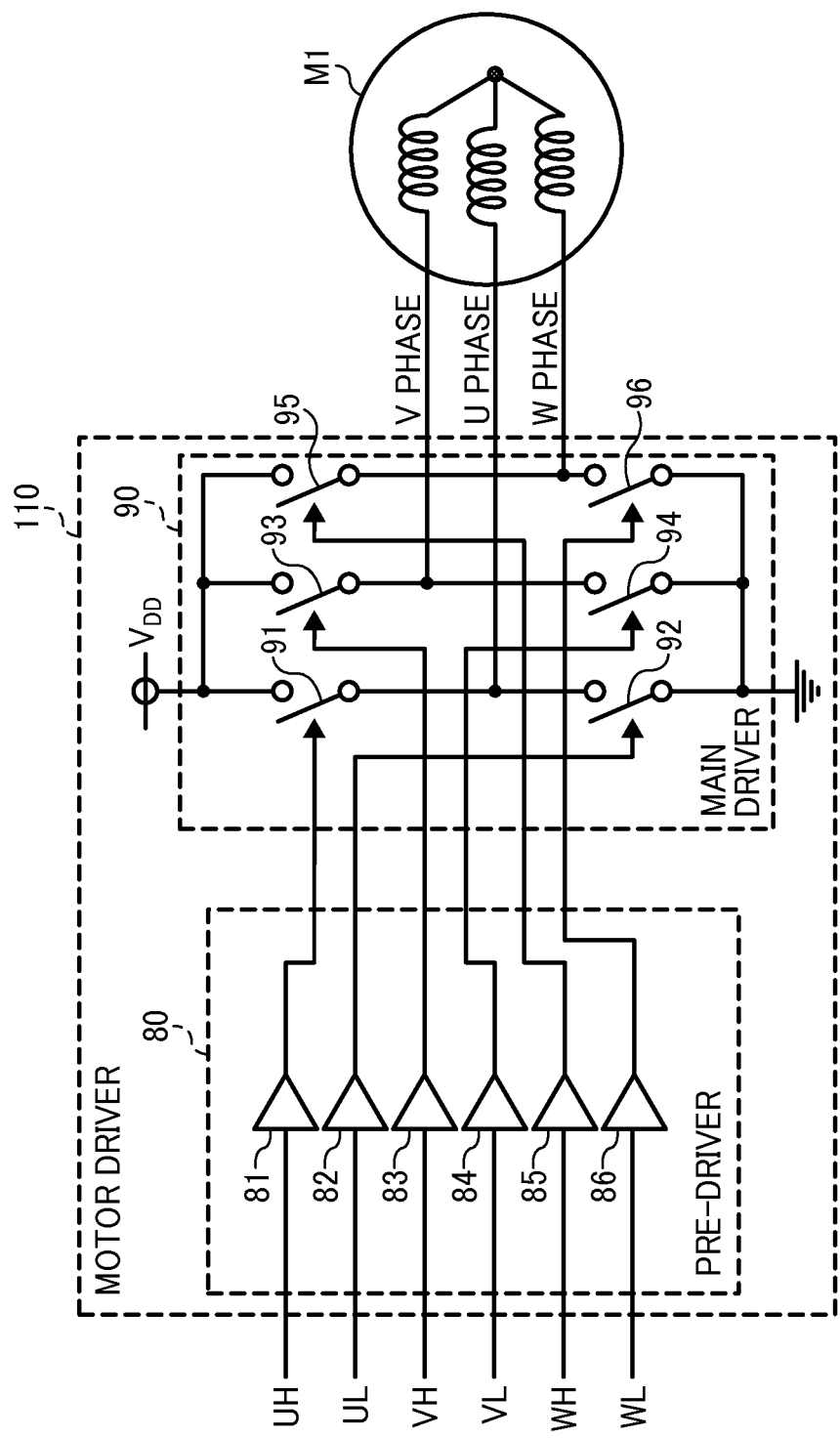
FIG. 24 is a block diagram illustrating the configuration of the motor drive unit 110 illustrated in FIG. 23.

FIG. 24 is a block diagram illustrating the configuration of the motor driver 110 illustrated in FIG. 23. The motor driver 110 has a pre-driver 80 and a main driver 90 as illustrated in FIG. 24. For example, the three phase coil to drive the motor M1 being as a brushless DC motor are defined as U phase, V phase, and W phase and one end of each coil is Y-connected in the motor M1. The main driver 90 is configured to have high side switch elements 91, 93, and 95 connected to the power supply and low side switch elements 92, 94, and 96 at each of the other ends of the coils. Furthermore, control signals UH, UL, VH, VL, WH, and WL of the switch to drive the switch elements 91 to 96 of each phase are output from the pre-driver 80.

The pre-drive 80 has six drive amplifiers 81 to 86 as illustrated in FIG. 24. The digital computing unit 200 selectively and sequentially outputs the PWM signal from the motor controller 100 based on the phase detection signals U2, V2, and W2 as one pair of control signals among a pair of the control signals UH and IL, a pair of the control signals VH and VL, and a pair of the control signals WH and WL. The digital computing unit 200 controls on and off of the switch element 91 on the high side by the control signal UH via the drive amplifier 81 and the switch element 92 on the low side by the control signal UL via the drive amplifier 82. The digital computing unit 200 controls on and off of the switch element 93 on the high side by the control signal VH via the drive amplifier 83 and the switch element 94 on the low side by the control signal VL via the drive amplifier 84. The digital computing unit 200 controls on and off of the switch element 95 on the high side by the control signal WH via the drive amplifier 85 and the switch element 96 on the low side by the control signal WL via the drive amplifier 86.

Figure 25:
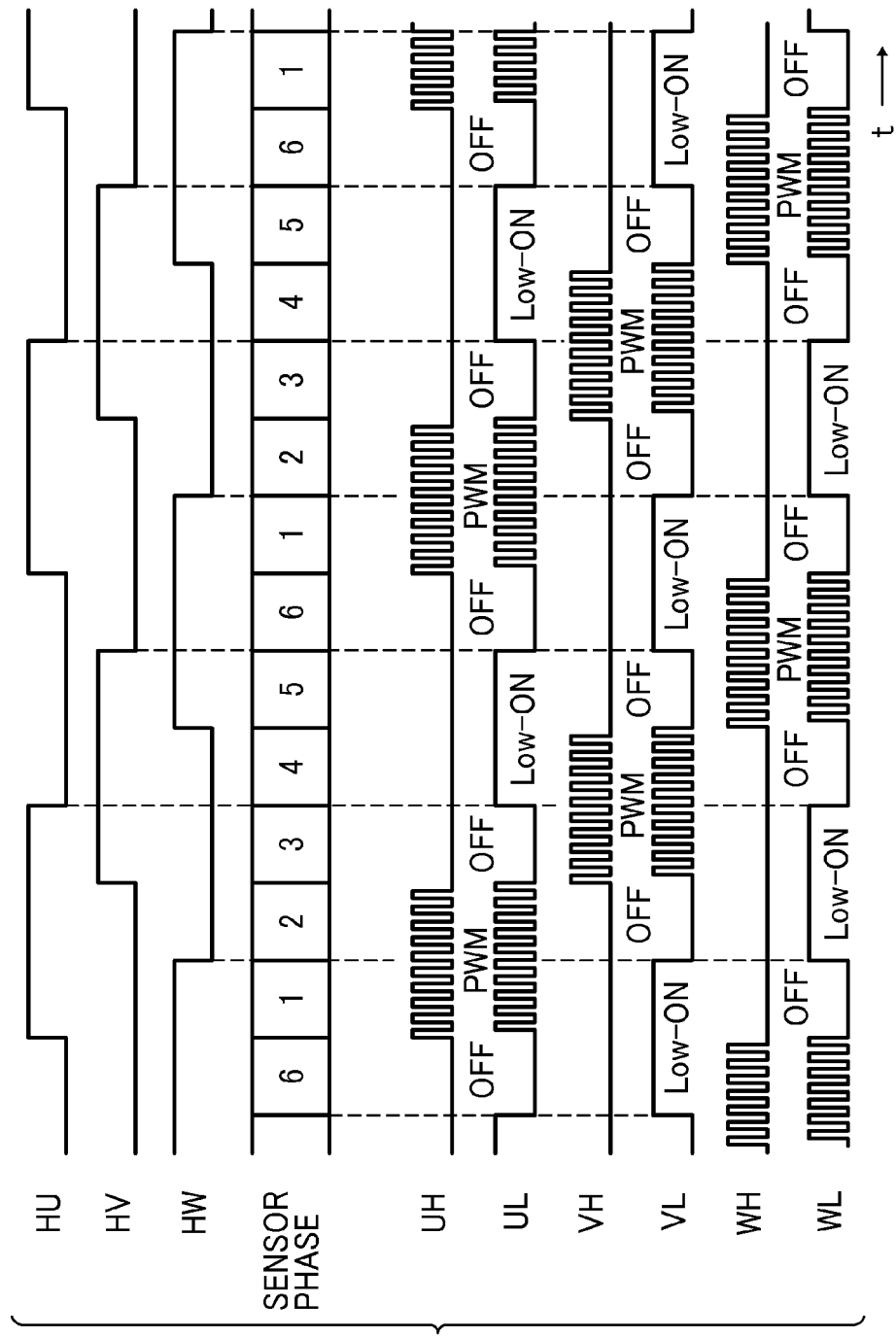
FIG. 25 is a timing diagram of each signal indicating operations of the motor drive unit 110 illustrated in FIG. 24.

FIG. 25 is a timing diagram of each signal indicating operation of the motor drive unit 110 illustrated in FIG. 24. FIG. 25 illustrates examples of switching phases in the signal logic of the sensor signals U1, V1, and W1, which is a general driving method driving a brushless DC motor. The motor controller 100 illustrated in FIG. 23 controls the duty cycle of the PWM signal based on the correct phase information as much as possible of the motor M1 in rotation and outputs the PWM signal to the motor driver 110. The digital computing unit 200 illustrated in FIG. 23 outputs the zero cross phase detection signals CMP_U, CMP_V, and CMP_W as commutation signals HU, HV, and HW that commutate in the coil of the motor M1. The digital computing unit 200 PMW-controls one of a pair of the switch elements 91 and 92, a pair of the switch elements 93 and 94, and a pair of the switch elements 95 and 96 based on the commutation signals HU, HV, and HW. The digital computing unit 200 switches the control signal of one of the other two pairs of switch elements to the low level based on the commutation signals HU, HV, and HW. The digital computing unit 200 switches the control signal of the last pair of the switch elements to the low level and set the control signal of the switch element on the low side to the high level. As a result, the digital computing unit 200 sorts to one of the phase that synchronous rectifies on the PWM duty cycle, the phase that switches on only the switch elements on the low side, and the phase that switches off both the switch elements on the high side and the low side.

Figure 26:
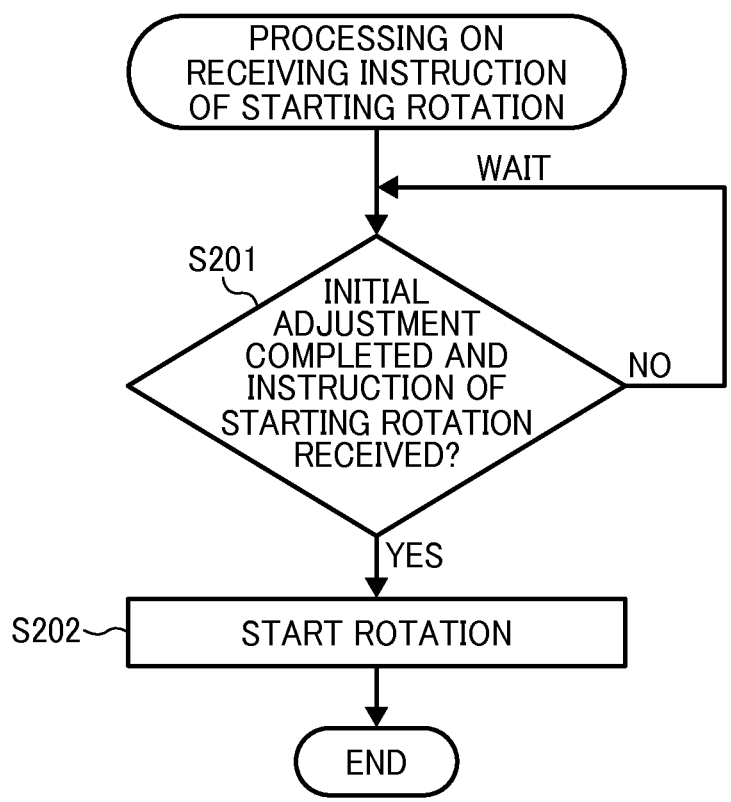
FIG. 26 is a flow chart indicating the process when receiving rotation start instruction of the digital computing unit 200 illustrated in FIG. 23.

FIG. 26 is a flow chart indicating processing of the digital computing unit 200 illustrated in FIG. 23 when a rotation starting instruction is received. FIG. 26 illustrates operations in the digital computing unit 200 from when the power supply is turned on to when the motor M1 starts rotation. The digital computing unit 200 determines whether the initial adjustment period illustrated in FIG. 20 is complete when the rotation starting instruction is received (Step S201). When the initial adjustment period is not complete (No at Step S201), the digital computing unit 200 stands by without starting rotation of the motor M1. When the initial adjustment period is complete (Yes at Step S201), the digital computing unit 200 starts rotation of the motor M1 (Step S202). For this reason, the motor illustrated in FIG. 23 does not rotate the motor M1 even if a rotation start instruction is input when the initial adjustment is not complete.

According to the motor device relating to the embodiment 4 as described above, for example, usage of a commonalized sensors S1, S2, and S3 and sensor for commutating the coil current to drive the motor M1 constituted of a brush less DC motor obviates the need for adding another sensor. That is, in the motor drive controller 3, by using a commutation signal of the coil current by a sensor provided to a typical motor, a number of phase information by the angle detector 1E is acquired.

Embodiment 6

Figure 27:
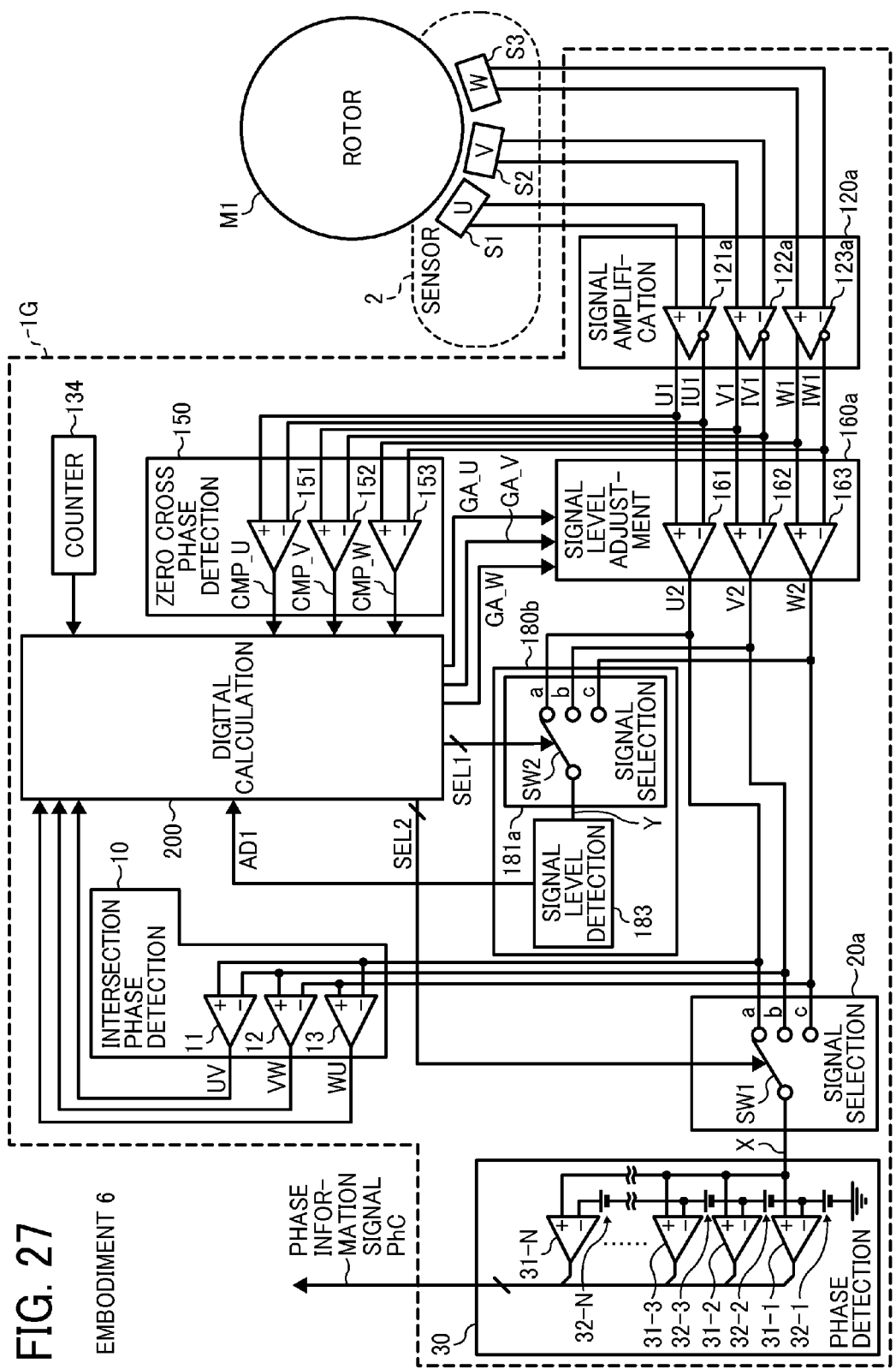
FIG. 27 is a block diagram illustrating a configuration of the angle detector 1G according to an embodiment 6 of the present invention together with a motor M1 and a sensor circuit 2.

FIG. 27 is a block diagram illustrating a configuration of the angle detector 1G according to the embodiment 6 of the present disclosure together with the motor M1 and the sensor circuit 2. FIG. 28(a) is waveforms indicating the sensor processed signals U2, V2, and W2 in the second and the third signal level adjustment of the angle detector 1G illustrated in FIG. 27. FIG. 28(b) is timing graphs indicating the zero cross phase detection signals CMP_U, CMP_V, and CMP_W that detected the zero cross phases of the sensor processed signals U2, V2, and W2 of FIG. 28(a).

The angle detector 1G illustrated in FIG. 27 is capable of adjusting the signal levels of the sensor processed signals U2, V2, and W2 at an earlier stage of phase detection in the case in which the motor M1 is rotating before the power is on such that the motor M1 is disturbed or manually rotated on purpose. The angle detector 1G is described below.

In FIG. 27, the digital computing unit 200 counts the time from when the power is on until when the power supply voltage becomes sufficiently stable by using a counter 134 according to a count number. After the counting by the counter 134 is complete, the digital computing unit 200 starts the second and the third signal level adjustment against each sensor processed signal U2, V2, and W2.

Figure 28:
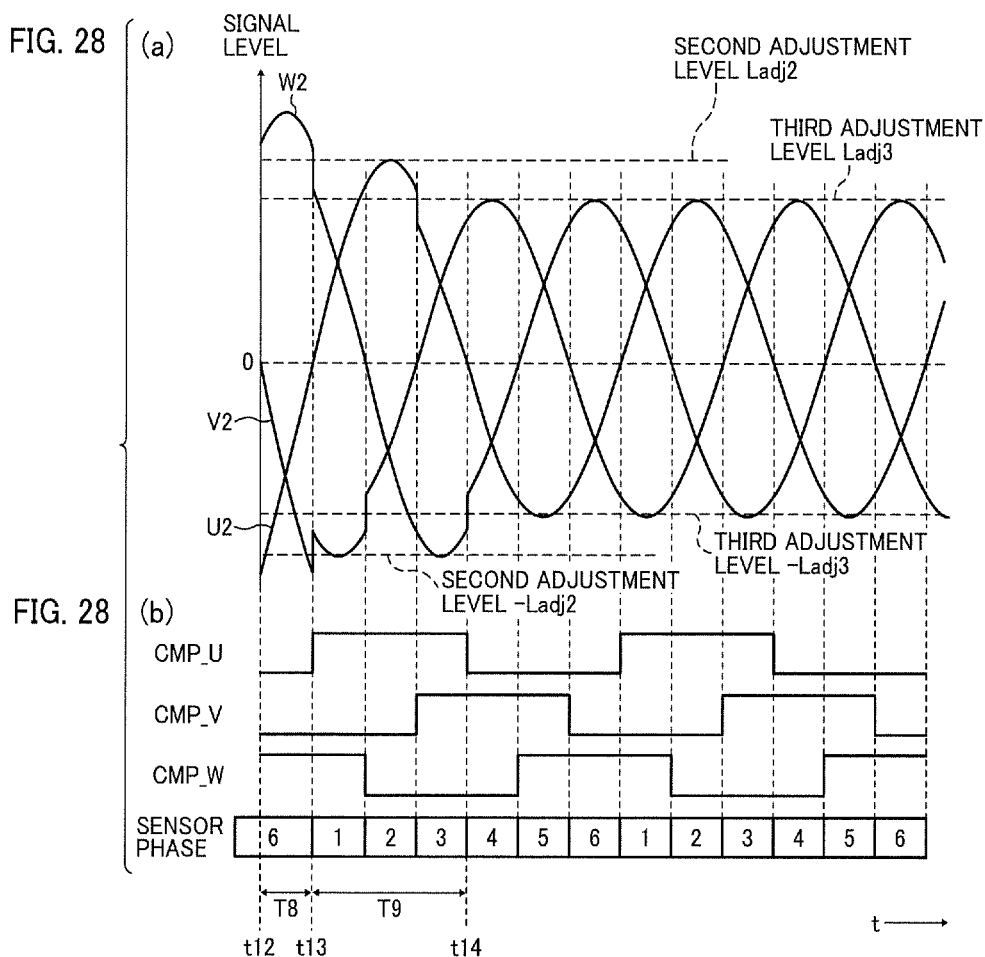
FIG. 28(a) is waveforms indicating the sensor processed signals U2, V2, and W2 in the second and the third signal level adjustment of the angle detector 1G illustrated in FIG. 27
FIG. 28(b) is timing diagrams indicating zero cross phase detection signals CMP_U, CMP_V, and CMP_W that detected zero cross phases of the sensor processed signals U2, V2, and W2 of FIG. 28(a)

In FIG. 28, the counting of the count number by the counter 134 is complete at the time t12. The angle detector 1G starts the signal level adjustment against the motor M1 in rotation at the time t12 even if the rotation starting instruction signal Sr is not received. The signal level detector 180b of the angle detector 1G detects the peak level of the sensor processed signal W2 at the period T8 between the time t12 and the time t13. The signal level adjuster 160a adjusts the signal level of each sensor processed signals U2, V2, and W2 in order to match the detected peak level with the second adjustment level Ladj2. Thereafter, the sensor phase switches three times in the period T9 from the time t13. That the sensor processed signals U2, V2, and W2 reach the second adjustment level in the period T9 is detected. The signal level adjuster 160a adjusts the signal levels of the sensor processed signals U2, V2, and W2 in order to be matched with the third adjustment level Ladj3.

Incidentally, the sensor processed signals U2, V2, and W2 are sine waves set with a shift of 120° therebetween, so that the digital computing unit 200 can calculate the peak level by multiplication of 1/0.866.

According to the angle detector 1G relating to embodiment 6 configured as described above, it is possible to adjust the signal levels of the sensor processed signals U2, V2, and W2 at an early stage of the phase detection by the rotation of the motor M1 even if the rotation instruction is not issued.

Variation Example

With regard to the first adjustment level Ladj1 of the angle detectors 1 and 1A to 1F relating to each embodiment, the intersection level LA of the signal level greater than the zero cross level is set to be larger than the threshold level LthA of the maximum value but the present disclosure is not limited thereto. The first adjustment level Ladj1 can be set such that the intersection level LB, which is a small signal level than the zero cross level, is smaller than the threshold level LthB of the minimum value of the multiple threshold level Lth's. It is also suitable to set the first adjustment level Ladj1 in such a manner that the signal level difference (absolute value) of each intersection level LA, LB, and the zero cross level is greater than the signal level difference between the zero cross level and any of the threshold level Lth.

The angle detectors 1, 1A, and 1B relating to each embodiment of the present disclosure have the signal amplifier 120 and the angle detector 1, 1C to 1G have the signal amplifier 120a but the present disclosure is not limiting thereto. The angle detectors 1 and 1A to 1G do not necessarily have the signal amplifier 120 or the signal amplifier 120a. The signal level adjusters 160 and 160a make preliminarily amplification to adjust the sensor processed signals U2, V2, and W2.

In the first signal level adjustment, the angle detectors 1 and 1A to 1G relating to each embodiment of the present disclosure continuously adjust the signal level of each sensor processed signal during the period T2 illustrated in FIG. 7. However, the present disclosure is not limited thereto and the signal level can be adjusted to match with the first adjustment level Ladj1 instantly.

The angle detectors 1 and 1A to 1G relating to each embodiment of the present disclosure detects the rotational position of the motor M1 against the three phase sensor processed signals U2, V2, and W2 but the present disclosure is not limited thereto. It is possible to detect the rotational position of the motor M1 against multiple phase sensor processed signals. For example, in the two sensor signals U1 and V1 set with an electrical angle shift of 90°, it is possible to detect the phase in the same manner as in the embodiment 1 by generating and overlapping the reversed-phase signal of each sensor signal and taking the selection signal X based on the intersection of each sensor signal.

The angle detectors 1 and 1A to 1G of each embodiment of the present disclosure take the same operations for multiple sensor processed signals which is obtained after particular signal-processing for the multiple sensor signals U1, V1, and W1 instead of the multiple sensor signals U1, V1, and W1. The same is true to other embodiments.

The motor relating to the embodiment 5 of the present disclosure has a motor drive controller 3 having the angle detector 1E but the present disclosure is not limited thereto. The motor drive controller relating to the present disclosure can have the angle detectors 1, 1A to 1D, 1F, and 1G. The motor relating to the present disclosure can have the motor drive controller.

According to a first aspect of the present disclosure, an angle detector includes a first signal level detector to detect a signal level closest to a peak level being a signal level of the peak value of a first set of sensor processed signals obtained by signal processing of multiple sensor signals and generate and output a detection level signal indicating the signal level closest to the peak level, each of the multiple sensor signals having a signal level corresponding to the rotational position of a rotor of a motor having multiple coils, a signal level adjuster to adjust each signal level of all the first set of the sensor processed signals to match the signal level closest to a peak level with a first adjustment level and output as a second set of sensor processed signals, a signal selector to single out a selection signal from the second set of sensor processed signals adjusted by the signal level adjuster, and a phase detector to detect that a signal level of the selection signal selected by the signal selector has reached a threshold level corresponding to a phase of the rotor and output a phase information signal indicating a phase corresponding to the threshold level.

According to a second aspect of the present disclosure, in the angle detector mentioned in the first aspect of the present disclosure, the signal level adjuster adjusts all the first set of sensor processed signals at a same signal amplification rate.

According to a third aspect of the present disclosure, the angle detector mentioned in the first or the second aspect of the present disclosure further includes a zero-cross phase detector to detect each zero-cross phase at which each of the first set of sensor processed signals passes a reference level and generate and output a zero-cross phase detection signal indicating the zero-cross phase, wherein the first signal level detector detects the signal level closest to the peak level of the first set of sensor processed signals based on the zero-cross phase detection signal.

According to a fourth aspect of the present disclosure, in the angle detector mentioned in any one of the third aspect of the present disclosure, the first signal level detector detects a phase section including the first set of sensor processed signals of multiple phase sections regulated by the zero cross phase based on the zero cross detection signal and selects one sensor processed signal from the first set of sensor processed signals for each detected phase section to detect the signal level closest to the peak level of the first set of sensor processed signals.

According to a fifth aspect of the present disclosure, the angle detector mentioned in any one of the first to the fourth aspect of the present disclosure further includes a second signal level detector to detect the peak level of the first set of sensor processed signals and generate and output a peak level signal, wherein the signal level adjuster adjusts and outputs each signal level of all the first set of sensor processed signals to match the peak level with a second adjustment level.

According to a sixth aspect of the present disclosure, the angle detector mentioned in the fifth aspect of the present disclosure, wherein the signal level adjuster operates based on the detection level signal from the first signal level detector in an initial adjustment period and based on the peak level signal from the second signal level detector after the initial adjustment period is complete.

According to a seventh aspect of the present disclosure, in the angle detector mentioned in the sixth aspect of the present disclosure, the second signal level detector detects each peak level of the first set of sensor processed signals adjusted to the second adjustment level by the signal level adjuster, wherein the signal level adjuster individually adjusts and outputs each signal level of the first set of sensor processed signals to match each peak signal level of the second set of sensor processed signals with a third adjustment level.

According to an eighth aspect of the present disclosure, in the angle detector mentioned in any one of the fifth to seventh aspects of the present disclosure, the first and second signal level detectors are wired to a common circuit.

According to a ninth aspect of the present disclosure, an angle detector includes a second signal level detector to detect a peak level being a signal level of a peak value of a first set of sensor processed signals obtained by signal processing of multiple sensor signals and generate and output a detection level signal indicating a detected peak level, each of the multiple sensor signals having a signal level corresponding to a rotational position of a rotor of a motor having multiple coils, a signal level adjuster to adjust each signal level of all the first set of the sensor processed signals to match the signal level closest to a peak level with a first adjustment level and output as a second set of sensor processed signals, a signal selector to single out a selection signal from the second set of sensor processed signals adjusted by the signal level adjuster, and a phase detector to detect that a signal level of the selection signal selected by the signal selector has reached a threshold level corresponding to a phase of the rotor and output a phase information signal indicating a phase corresponding to the threshold level.

According to a tenth aspect of the present disclosure, in the angle detector mentioned above in the ninth aspect of the present disclosure, the second signal level detector detects each peak level of the second set of sensor processed signals adjusted to the second adjustment level by the signal level adjuster and the signal level adjuster individually adjusts and outputs each signal level of the first set of sensor processed signals to match each peak signal level of the second set of sensor processed signals with a third adjustment level.

According to an eleventh aspect of the present disclosure, the angle detector mentioned above in any one of the first to the tenth aspect of the present disclosure further includes an intersection phase detector to compare each pair of signals of the first set of sensor processed signals and generate and output an intersection phase detection signal indicating the phase of the intersection of the each pair of signals.

According to a twelfth aspect of the present disclosure, in the angle detector mentioned above in the eleventh aspect of the present disclosure, the signal selector singles out a selection signal from the first set of sensor processed signals for each of phase sections between adjacent intersections of each intersection and combines each selection signal.

According to a thirteenth aspect of the present disclosure, in the angle detector mentioned above in the twelfth aspect of the present disclosure, each phase section between the adjacent intersections corresponds to a range of from an electrical angle of 30° to 60°.

According to a fourteenth aspect of the present disclosure, a motor drive controller includes the angle detector mentioned above in any one of the first to thirteenth aspect of the present disclosure, wherein a motor is driven and controlled based on a phase information signal from the angle detector mentioned above.

According to a fifteenth aspect of the present disclosure, a motor device includes the motor drive controller mentioned above in the fourteenth aspect of the present disclosure and a motor driven and controlled by the motor drive controller.

According to the present disclosure, the rotational position of the rotor of a motor is detected with a high precision even if the amplitudes of sensor signals vary.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An angle detector comprising:
   a first signal level detector to detect a sensor processed signal having a maximum signal level of a first set of sensor processed signals obtained by signal processing of multiple sensor signals, each of the multiple sensor signals having a signal level corresponding to a rotational position of a rotor of a motor having multiple coils,
   a signal level adjuster to adjust each signal level of the first set of the sensor processed signals to match the sensor processed signal having a maximum signal level with a first adjustment level,
   a signal selector to single out a selection signal from a second set of sensor processed signals adjusted by the signal level adjuster, and
   a phase detector to output a phase information signal in which a signal level of selection signal selected by the signal selector corresponds to a phase of the rotor.

2. The angle detector according to claim 1, wherein the signal level adjuster adjusts all the first set of sensor processed signals at a same signal amplification rate.

3. The angle detector according to claim 1, further comprising a zero-cross phase detector to detect each zero-cross phase at which each of the first set of sensor processed signals passes a reference level and generate and output a zero-cross phase detection signal indicating the zero-cross phase, wherein the first signal level detector detects the sensor processed signal having the maximum signal level of the first set of sensor processed signals based on the zero-cross phase detection signal.

4. The angle detector according to claim 3, wherein the first signal level detector detects a phase section including the first set of sensor processed signals of multiple phase sections regulated by the zero cross phase based on the zero cross detection signal and selects one sensor processed signal from the first set of sensor processed signals for each detected phase section to detect the signal level closest to the peak level of the first set of sensor processed signals.

5. The angle detector according to claim 1, further comprising a second signal level detector to detect a peak level of the first set of sensor processed signals and generate and output a peak level signal, wherein the signal level adjuster adjusts and outputs each signal level of all the first set of sensor processed signals to match the peak level with a second adjustment level.

6. The angle detector according to claim 5, wherein the signal level adjuster operates based on the detection level signal from the first signal level detector in an initial adjustment period and based on the peak level signal from the second signal level detector after the initial adjustment period is complete.

7. The angle detector according to claim 6, wherein the second signal level detector detects each peak level of the first set of sensor processed signals adjusted to the second adjustment level by the signal level adjuster, wherein the signal level adjuster individually adjusts and outputs each signal level of the first set of sensor processed signals to match each peak signal level of the second set of sensor processed signals with a third adjustment level.

8. The angle detector according to claim 5, wherein the first and second signal level detectors are wired to a common circuit.

9. The angle detector according to claim 1, further comprising an intersection phase detector to compare each pair of signals of the first set of sensor processed signals and generate and output an intersection phase detection signal indicating a phase of an intersection of the each pair of signals.

10. The angle detector according to claim 9, wherein the signal selector singles out a selection signal from the first set of sensor processed signals for each of phase sections between adjacent intersections of each intersection and combines each selection signal.

11. The angle detector according to claim 10, wherein each phase section between the adjacent intersections corresponds to a range of from an electrical angle of 30° to 60°.

12. A motor drive controller comprising:
the angle detector of claim 1,
wherein a motor is driven and controlled based on a phase information signal from the angle detector.

13. A motor device comprising:
the motor drive controller of claim 12; and
a motor driven and controlled by the motor drive controller.

14. An angle detector comprising:
a second signal level detector to detect a peak level of a first set of sensor processed signals obtained by signal processing of multiple sensor signals and generate and output a detection level signal indicating a detected peak level, each of the multiple sensor signals having a signal level corresponding to a rotational position of a rotor of a motor having multiple coils,
a signal level adjuster to adjust each signal level of all the first set of the sensor processed signals to match the signal level closest to a peak level with a second adjustment level and output as a second set of sensor processed signals,
a signal selector to single out a selection signal from the second set of sensor processed signals adjusted by the signal level adjuster, and
a phase detector to detect that a signal level of the selection signal selected by the signal selector has reached a threshold level corresponding to a phase of the rotor and output a phase information signal indicating a phase corresponding to the threshold level.

15. The angle detector according to claim 14, wherein the second signal level detector detects each peak level of the second set of sensor processed signals adjusted to the second adjustment level by the signal level adjuster and the signal level adjuster individually adjusts and outputs each signal level of the first set of sensor processed signals to match each peak signal level of the second set of sensor processed signals with a third adjustment level.

16. The angle detector according to claim 14, further comprising an intersection phase detector to compare each pair of signals of the first set of sensor processed signals and generate and output an intersection phase detection signal indicating a phase of an intersection of the each pair of signals.

17. The angle detector according to claim 16, wherein the signal selector singles out a selection signal from the first set of sensor processed signals for each of phase sections between adjacent intersections of each intersection and combines each selection signal.

* * * * *